(12) United States Patent
Rohde et al.

(10) Patent No.: US 7,636,021 B2
(45) Date of Patent: Dec. 22, 2009

(54) LOW NOISE AND LOW PHASE HITS TUNABLE OSCILLATOR

(75) Inventors: Ulrich L. Rohde, Upper Saddle River, NJ (US); Ajay Kumar Poddar, Fair Lawn, NJ (US); Klaus Juergen Schoepf, Ringwood, NJ (US); Reimund Rebel, Ringwood, NJ (US); Hua Zhang, Whippany, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 140 days.

(21) Appl. No.: 11/438,047

(22) Filed: May 19, 2006

(65) Prior Publication Data

US 2006/0279368 A1 Dec. 14, 2006

Related U.S. Application Data

(60) Provisional application No. 60/683,533, filed on May 20, 2005.

(51) Int. Cl.
| H03B 5/08 | (2006.01) |
| H03B 5/18 | (2006.01) |
| H03B 5/12 | (2006.01) |
| H03K 3/282 | (2006.01) |
| H03K 3/354 | (2006.01) |

(52) U.S. Cl. ............... 331/167; 331/117 R; 331/117 E
(58) Field of Classification Search ............ 331/16, 331/34, 108 R, 117 FE, 107 SL, 132
See application file for complete search history.

(56) References Cited

U.S. PATENT DOCUMENTS

| 2,502,488 A | 4/1950 | Shockley |
| 2,524,035 A | 10/1950 | Bardeen et al. |
| 3,373,379 A | 3/1968 | Black |
| 3,624,550 A * | 11/1971 | Vane ..................... 331/96 |
| 4,310,809 A | 1/1982 | Buck et al. |
| 4,338,576 A | 7/1982 | Takahashi et al. |
| 4,435,688 A | 3/1984 | Shinkawa et al. |
| 4,479,259 A | 10/1984 | Fenk et al. |
| 4,527,130 A | 7/1985 | Lutteke |
| 4,590,443 A * | 5/1986 | Ishigaki et al. ......... 331/117 R |
| 4,619,001 A | 10/1986 | Kane |

(Continued)

FOREIGN PATENT DOCUMENTS

DE 344 3446 A1 5/1986

(Continued)

OTHER PUBLICATIONS

D. Ham, A. Hajimiri, "Concepts and Methods in Optimization of Integrated LCVCOs," IEEE Journal of Solid-state Circuits, Jun. 2001.

(Continued)

*Primary Examiner*—Robert Pascal
*Assistant Examiner*—Gerald Stevens
(74) *Attorney, Agent, or Firm*—Lerner, David, Littenberg, Krumholz & Mentlik, LLP

(57) ABSTRACT

A voltage controlled oscillator compising a distributed coupled resonator (DCR) that desirably produces a low noise signal source with reduced phase hits in comparison to a high Q resonator, such as a ceramic and SAW (Surface Acoustic Wave) resonator based oscillator.

19 Claims, 13 Drawing Sheets

U.S. PATENT DOCUMENTS

| | | | |
|---|---|---|---|
| 4,621,241 A | 11/1986 | Kiser | |
| 4,633,197 A | 12/1986 | Vanderspool, II | |
| 4,661,785 A | 4/1987 | Benjaminson | |
| 4,677,396 A | 6/1987 | Cruz et al. | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,053,649 A | 10/1991 | Johnson | |
| 5,142,255 A | 8/1992 | Chang et al. | |
| 5,187,451 A | 2/1993 | Nakamoto et al. | |
| 5,223,801 A * | 6/1993 | Bergman | 331/76 |
| 5,231,361 A | 7/1993 | Smith et al. | |
| 5,363,067 A | 11/1994 | Crandall et al. | |
| 5,373,264 A | 12/1994 | Higgins | |
| 5,402,087 A | 3/1995 | Gorczak | |
| 5,434,542 A | 7/1995 | Veith et al. | |
| 5,650,754 A | 7/1997 | Joshi | |
| 5,661,439 A | 8/1997 | Watkins et al. | |
| 5,748,051 A | 5/1998 | Lewis | |
| 5,821,410 A | 10/1998 | Xiang et al. | |
| 5,854,578 A | 12/1998 | Minasi et al. | |
| 5,856,763 A | 1/1999 | Reeser et al. | |
| 5,900,788 A | 5/1999 | Hagemeyer et al. | |
| 6,091,309 A * | 7/2000 | Burke et al. | 331/117 R |
| 6,124,767 A | 9/2000 | Woods | |
| 6,172,577 B1 * | 1/2001 | Oe et al. | 331/117 D |
| 6,242,843 B1 * | 6/2001 | Pohjonen et al. | 310/313 R |
| 6,294,964 B1 * | 9/2001 | Satoh | 331/117 R |
| 6,297,708 B1 | 10/2001 | Lemay | |
| 6,326,854 B1 | 12/2001 | Nicholls et al. | |
| 6,392,452 B2 * | 5/2002 | Lee | 327/108 |
| 6,486,744 B1 | 11/2002 | Cann et al. | |
| 6,489,853 B1 | 12/2002 | Lewis | |
| 6,501,341 B2 | 12/2002 | Mashimo et al. | |
| 6,624,726 B2 | 9/2003 | Niu | |
| 6,630,869 B2 | 10/2003 | Flynn et al. | |
| 6,714,088 B2 | 3/2004 | Chang | |
| 6,714,772 B2 | 3/2004 | Kasahara et al. | |
| 6,731,181 B2 | 5/2004 | Fukayama et al. | |
| 6,734,745 B2 | 5/2004 | Sakai | |
| 6,737,928 B2 | 5/2004 | Kubo et al. | |
| 6,825,734 B2 * | 11/2004 | Clark | 331/96 |
| 7,061,333 B2 | 6/2006 | Aikawa et al. | |
| 7,088,189 B2 | 8/2006 | Rohde et al. | |
| 7,102,453 B1 | 9/2006 | Rohde et al. | |
| 7,180,381 B2 | 2/2007 | Rohde et al. | |
| 7,262,670 B2 | 8/2007 | Rohde et al. | |
| 7,292,113 B2 | 11/2007 | Rohde et al. | |
| 2001/0004225 A1 | 6/2001 | Nicholls et al. | |
| 2001/0030583 A1 | 10/2001 | Ikarashi | |
| 2001/0035794 A1 | 11/2001 | Fujidai et al. | |
| 2002/0084860 A1 | 7/2002 | Festag et al. | |
| 2003/0160660 A1 | 8/2003 | Chang et al. | |
| 2004/0095197 A1 | 5/2004 | Wang et al. | |
| 2004/0113707 A1 * | 6/2004 | Fredriksson | 331/135 |
| 2004/0130402 A1 | 7/2004 | Marquardt | |
| 2004/0222858 A1 * | 11/2004 | Corse et al. | 331/36 C |
| 2004/0227578 A1 | 11/2004 | Hamalainen | |
| 2005/0156683 A1 | 7/2005 | Rohde et al. | |
| 2005/0242896 A1 | 11/2005 | Rohde et al. | |
| 2005/0280478 A1 | 12/2005 | Patel et al. | |

FOREIGN PATENT DOCUMENTS

| | | | |
|---|---|---|---|
| DE | 3443446 A | | 5/1986 |
| EP | 0 475 262 A | | 3/1992 |
| EP | 0 475 262 A1 | | 8/1992 |
| EP | 0 800 224 A | | 10/1997 |
| EP | 0 800 224 A2 | | 10/1997 |
| EP | 0 823 777 | | 2/1998 |
| EP | 0 843 374 A | | 5/1998 |
| EP | 0 843 374 A2 | | 5/1998 |
| EP | 1 093 216 A | | 4/2001 |
| EP | WO2001047102 | * | 6/2001 |
| EP | 1 480 286 A1 | | 11/2004 |
| JP | 59-072205 | | 4/1984 |
| JP | 59-072205 A | | 4/1984 |
| JP | 59-139708 | | 8/1984 |
| JP | 59-139708 A | | 8/1984 |
| WO | WO 02/05416 | | 1/2002 |
| WO | WO 02/17476 | | 2/2002 |
| WO | WO-02/17476 A | | 2/2002 |
| WO | WO-02/005416 A1 | | 11/2002 |
| WO | WO-2005/0015731 | | 2/2005 |

OTHER PUBLICATIONS

U.L. Rohde, A Novel RFIC for UHF Oscillators (Invited), 2000 IEEE Radio Frequency Integrated Circuits (RFIC) Symposium, Boston, MA, Jun. 11-13, 2000.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

H.C. Chang, "Phase noise self-injection-locked oscillators- Theory and experiment,." IEEE Transactions on Microwave Theory and Techniques, vol. 51, No. 9, pp. 1994 - 1999, Sep. 2003.

Franz X. Sinnesbichler, "Hybrid Millimeter-Wave Push-Push Oscillators using Silicon-Germanium HBTs," IEEE MTT-S, vol. 51, Feb. 2003.

U.L. Rohde, D.P. Newkirk, RF/Microwave Circuit Design for Wireless Applications, pp. (123-197), John Wiley & Sons, Apr. 2000, ISBN 0-471-29818-2.

Douglas R. Jachowski, "Passive Enhancement of Resonator Q in Microwave Notch Filters", IEEE MTT-S Digest, pp. 1315-1318, Jun. 2004.

A. K. Poddar, S.K. Koul, and B. Bhat, "Millimeter Wave Evanescent Mode Gunn Diode Oscillator in Suspended Stripline Configuration." $22^{nd}$ international Conference on Millimeter Waves, pp. 265-266, Jul. 1997.

Henkes, Dale D, 'Designing Short High Q Resonators', Design, Dec. 2003, pp. 75-109.

U.L. Rohde, "Novel RFIC for UHF Oscillators (Invited)," 2000 IEEE Radio Frequency Integrated Circuits (RFIC) Symposium, Boston, MA, Jun. 11-13, 2000.

Ulrich Rohde, "A New and Efficient Method of Designing Low Noise Microwave Oscillators," PhD Dissertation, Technical University of Berlin, 2004.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Wing Shing Chan et al: "The design of oscillators using the cascode circuit" Circuits and Systems, 1994, vol. 5, pp. 689-692, May 30, 1994.

Franz X. Sinnesbichler, "Hybrid Millimeter-Wave Push-Push Oscillators Using Silicon-Germanium HBTs," IEEE MTT-S, vol. 51, Feb. 2003.

S. Kudszus, W. H. Haydi, A. Tessmann, W. Bronner, and M. Schlechtweg, "PushPush Oscillators for 94 and 140 0Hz Applications Using Standard Pseudomorphic GaAs HEMTs,"IEEE MTT-S, Microwave Symp. Digest, 2001, pp. 1571-1574.

Y. Baeyens et al., "Compact InP-based HBT VCOs with a Wide Tuning Range at W-Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

M. Schott, H. Kuhnert, J. Hilsenbeck, J. Wurlf, and H. Heinrich, "38 GHz Push-Push GaAs-HBT MMIC Oscillator," IEEE MTT-S, Digest, 2002, pp. 839-842.

F. X. Sinnesbichler and 0. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, H. Geltinger, and G. R. Olbrich, "A 38 OHz Push-Push Oscillator Based on 25 GHZ-fT BJTs," IEEE Microwave Guided Wave Lett. vol. 9 pp. 151-153, Apr. 1999.

K. W. Kobayashi et al., "A 108-0Hz InP-based HBT Monolithic Push-Push VCO with Low Phase Noise and Wide Tuning Bandwidth," IEEE J. Solid-State Circuits, vol. 34, pp. 1225-1232, Sep. 1999.

L. Dussopt, D. Guillois, and 0. Rebeiz, "A Low Phase Noise Silicon 9 0Hz VCO and an 18 0Hz Push-Push Oscillator," IEEE MTT-S. Digest, 2002, pp. 695-698.

F. X. Sinnesbichier, B Hauntz and 0. R. Olbrich, "A Si/SiGe HBT Dielectric Resonator Push-Push Oscillators at 58 GHz," IEEE Microwave Guided Wave Lett. vol. 10, pp. 145-147, Apr. 2000.

U. L. Rohde, "A New and Efficient Method of Designing Low Noise Oscillators," Ph.D. Dissertation, Technical University of Berlin, Feb. 12, 2004.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

B. Van der Pol, "The Nonlinear Theory of Electrical Oscillators," Proc. IRE, vol. 22 No. 9, pp. 1051-1086, Sep. 1934.

R. Adler, "A Study of Locking Phenomena in Oscillators," Proc. IEEE, vol. 61, pp. 180-1385, Oct. 1973.

D. B. Leeson, A Simple Model of Feedback Oscillator Noise Spectrum, Proc. IEEE, pp. 329-332, 1966.

M. Odyniec, Editor, RF and Microwave Oscillator Design, Chapter 3: Linearity, Time Variation, and Oscillator Phase Noise, by T. Lee and A. Hajimiri, Artech House, 2002.

M. Ahdjoudj, "Conception de VCO a Faible Bruit de Phase en Technologie Monolithique PHEMT dans les Bandes K et Ka," Ph.D. Thesis, Doctorat De L' Universite Pierre Et Marie Curie Paris VI, Dec. 1997.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

Heng-Chia Chang, Xudong Cao, Mark J. Vaughan, Umesh K. Mishra, and R. York, "Phase Noise in Externally Injection-Locked Oscillator Arrys," IEEE Trans. MTT, vol. 45, pp. 2035-2042, Nov. 1997.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Jonathan J. Lynch and Robert A. York, "Synchronization of Oscillators Coupled through Narrow-Band Networks," IEEE Trans. MTT, pp. 238-249, Feb. 2001.

Klaus F. Schunemann and Karl Behm, "Nonlinear Noise Theory for Synchronized Oscillators," IEEE Trans. MTT, vol. 27, pp. 452-458, May 1979.

Kaneyuki Kurokawa, "The Single Cavity Multiple Device Oscillator," IEEE Trans. MTT, vol. 19, pp. 793-801, Oct. 1971.

Kaneyuki Kurokawa, "Noise in Synchronized Oscillators," IEEE Trans. MTT, vol. 16, pp. 234-240, Apr. 1968.

Byeong-Ha Park, "A Low-Voltage, Low Power, CMOS 900 MHz Frequency Synthesizer," Ph.D. Dissertation, Georgia Institute of Technology, Dec. 1997.

W. 0. Schlosser, "Noise in Mutually Synchronized Oscillators," IEEE Trans. Microwave Theory Tech., vol. MTT-16, pp. 732-737, Sep. 1968.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Reidar L. Kuvas, "Noise in Single Frequency Oscillators and Amplifiers," IEEE Trans. Microwave Theory Tech., vol. MTT-21, pp. 127-134, Mar. 1973.

H. Stark, and J. W. Woods, Probability, Random Processes, and Estimation Theory for Engineers. New York: Prentice-Hall, 1986.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. A. York, "Nonlinear Analysis of Phase Relationship in Quasi-Optical Oscillator Arrays," IEEE Trans. Microwave Theory Tech., vol. 41, pp. 1799-1809, Oct. 1993.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Franco Ramirez, Jose Lius Garcia H., Tomas Fernandez and Almudena Suarez, "Nonlinear Simulation Techniques for the Optimized Design of Push-Push Oscillators", IEEE, MTT-S Digest, pp. 2157-2160, 2003.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

F. X. Sinnesbichier, B. Hautz, G. R. Olbrich, "A Low Phase Noise 58 GHz SiGe HBT Push-Push, Oscillator with Simultaneous 29 GHz Output", IEEE, MTT-S Digest, pp. 35-38, 2000.

Hai Xiao, Takayuki Tanka and Masayoshi Aikawa, "A Ka-Band Quadruple-Push Oscillator", IEEE, MTT-S Digest, pp. 889-892, 2003.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 2169-2172, 2003.

J. Heinbockel and A. Mortazawi, "A Periodic Spatial Power Combining MESFET Oscillator", IEEE, MTT-S Digest, pp. 545-548, 1992.

M. Kuramitsu and F. Takasi, "Analytical method for Multimode Oscillators Using the Averaged Potential," Elec. Communication Japan, vol. 66-A, pp. 10-19, 1983.

Ronald G. Freitag, "A Unified Analysis of MMIC Power Amplifier Stability,"IEEE, MTT-S Digest, pp. 297-300, 1992.

Shigeji Nogi, Jenshan Lin and Tatsuo Itoh., Mode Analysis and Stabilization of a Spatial Power Combining Array with Strongly Coupled oscillators, IEEE, MTT, vol. 41, pp. 1827-1837, Oct. 1993.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

R. A. York and R.C. Compton, "Mode-Locked Oscillator Arrays", IEEE Microwave and Guided Letter, vol. 1, pp. 215-218, Aug. 1991.

Yu-Lung Tang and Huei Wang, "Triple-Push Oscillator Approach: Theory and Experiments," IEEE- JSS, vol. 36, pp. 1472-1479, Oct. 2001.

J. Everard, Fundamentals of RE Circuit Design with Low Noise Oscillators, John Wiley & Sons. Ltd, 2001.

U.L. Rohde, "New Nonlinear Noise Model for MESFETS Including MM-Wave Application," First International Workshop of the West German IEEE Mfl/AP Joint Chapter on Integrated Nonlinear Microwave and Millimeter wave Circuits (INMMC'90) Digest, Oct. 3-5, 1990, Duisburg University, Germany.

U.L. Rohde, "Improved Noise Modeling of GaAs FETS: Using an Enhanced Equivalent Circuit Technique," Microwave Journal, pp. 87-101—Nov. 1991.

WA. Pucel, W. Struble, R Hallgren, U.L. Rohde, "A General Noise Dc-embedding Procedure for Packaged Two-Port Linear Active Devices," IEEE Transactions on MTT, vol. 40, No. 11, pp. 2013-2024, Nov. 1992.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

C. Arnaud, D. Basataud, J. Nebus, J. Teyssier, J. Villotte, D. Floriot, "An Active Pulsed RF and Pulsed DC Loan-Pull System for the Characterization of HBT Power Amplifiers Used in Coherent Radar and Communication Systems," IEEE Transactions on Mfl, vol. 48, No. 12, pp. 2625-2629, Dec. 2000.

F.M. Ghannouchi, R. Larose, R.G. Bosisio, "A New Multi-harmonic Loading Method for Large-Signal Microwave and Millimeter-Wave Transistor Characterization," IEEE Transactions on MTT, vol. 39, No. 6, pp. 986-992, Jun. 1991.

H. Abe, Y. Aono, 11 GHz GaAs Power MESFET Loan-Pull Measurements Utilizing a New Method of Determining Tuner Y-Parameters, IEEE Transactions on Microwave Theory and Techniques, vol. 27, No. 5, pp. 394-399, May 1979.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161 - 165, Jun. 7-12, 1998.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943 -950, Jun. 1994.

D. M. Pozar, Microwave Engineering, John Wiley & Sons, 2nd Edition, 1998.

A. M. Elsayed and M. I. Elmasry, "Low-Phase-Noise LC Quadrature VCO using Coupled Tank Resonators in Ring," IEEE, JSSC, vol. 36, pp. 701-705, Apr. 2001.

M. Ticbout, "Low power, Low Phase Noise, Differentially Tuned Quadrature VCO Design in Standard CMOS," IEEE- JSSS, vol. 36, pp. 10 18-1024, Jul. 2001.

K.O, "Estimation Methods for Quality Factors of Inductors Fabricated in Silicon Integrated Circuit Process Technologies," IEEE, JSSS, pp. 1565-1567, Sep. 1997.

A.V. Grebennikov, "Microwave Transistor Oscillators: an Analytic Approach to Simplify Computer-Aided Design", Microwave Journal, pp. 294-299, May 1999.

Andrew V. Grebennikov, "Microwave FET Oscillators: an Analytic Approach to Simplify Computer-Aided Design", Microwave journal, pp. 102-111, Jan. 2000.

Jwo-Shiun Sun, "Design Analysis of Microwave Varactor-Tuned Oscillators", Microwave journal, pp. 302-308, May 1999.

M. Regis, 0. Llopis, and J. Graffeuil, "Nonlinear Modeling and Design of Bipolar Transistor Ultra Low Phase-Noise Dielectric-Resonator Oscillators", IEEE transaction on MTT, vol. 46, No. 10, pp. 1589-1593, Oct. 1998.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, K. Juergen Schoepf, A.K. Poddar, "Low Noise VCOs Conquer Wideband," Microwaves & RF, pp. 98-106, Jun. 2004.

U. L. Rohde and A. K. Poddar, "Noise Analysis of Systems of Coupled Oscillators", (INMMIC) workshop, Italy, Nov. 15-16, 2004.

A. K. Poddar and K. N. Pandey, "Microwave Switch using MEMS technology," 8th IEEE International Symposium, EDMO-2000, pp. 134-139, Nov. 2000, UK.

A. Ward and B. Ward, "A Comparison of various Bipolar Transistor Biasing Circuits," Applied Microwave & Wireless, vol. 13, pp. 30-52, 2001.

U. L. Rohde and A. K. Poddar, "Ultra Low Noise Low Cost Multi Octave Band VCO", IEEE Sarnoff Symposium, Princeton, NJ, USA, Apr. 2005.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

U. L. Rohde, A. K. Poddar, and Juergen Schoepf, "A Unifying Theory and Characterization of Microwave Oscillators/VCOs," 18th IEEE CCECEO5, May 2005, Canada.

U. L. Rohde and A. K. Poddar, "Configurable Ultra Low Ultra Wideband Power Efficient VCOs", 1 1th European Wireless, Apr. 2005.

U. L. Rohde, A. K. Poddar, and Reimund Rebel, "Ultra Low Noise Low Cost Octave-Band Hybrid-Tuned VCO," 18th IEEE CCECEOS, May 2005, Canada.

K. Poddar, A Novel Approach for Designing Integrated Ultra Low Noise Microwave Wideband Voltage-Controlled Oscillators, Dec. 14, 2004.

Kai Chang (ed.): "Encyclopedia of RF and Microwave Engineering, vol. 1-6", Apr. 2005, John Wiley & Sons, Hoboken, New Jersey, pp. 4744 - 4760.

Shitikov, "Stables Shelf-Excited Oscillators of Meter and Decimeter Waves", Moscow (1983).

Sun, S. et al "Guided-Wave Characteristics of Periodically Nonuniform Coupled Microstrip Lines-Even and Odd Modes", IEEE Transactions on Microwave Theory and Techniques, IEEE Service Center, Piscataway, NJ, US, vol. 53, No. 4, Apr. 2005, pp. 1221-1227.

* cited by examiner

622 MHz OSCILLATOR/VCO

2488 MHz OSCILLATOR/VCO

LOW NOISE AND LOW PHASE HITS TUNABLE OSCILLATOR

CROSS-REFERENCE TO RELATED APPLICATIONS

This application claims the benefit of the filing date of U.S. Provisional Application No. 60/683,533 filed May 20, 2005, the disclosure of which is hereby incorporated herein by reference.

BACKGROUND OF THE INVENTION

This invention generally relates to voltage controlled oscillators (VCOs) or oscillator circuits, and more particularly to low noise and low phase hit tunable oscillator circuits. A voltage controlled oscillator or oscillator is a component that can be used to translate DC voltage into a radio frequency (RF) voltage or signal. In general, VCOs are designed to produce an oscillating signal at a particular frequency 'f' that corresponds to a given tuning voltage. The frequency of the oscillating signal is dependent upon the magnitude of a tuning voltage $V_{tune}$ applied to a tuning network across a resonator circuit. The frequency 'f' may be varied from $f_{min}$ to $f_{max}$ and these limits are referred to as the tuning range or bandwidth of the VCO. The tuning sensitivity of the VCO is defined as the change in frequency over the tuning voltage. It is usually desirable to tune the VCO over a wide frequency range within a small tuning voltage range.

The magnitude of the output signal from a VCO depends on the design of the VCO circuit. The frequency of operation is in part determined by a resonator that provides an input signal. Clock generation and clock recovery circuits typically use VCOs within a phase locked loop (PLL) to either generate a clock from an external reference or from an incoming data stream. VCOs are often critical to the performance of PLLs. In turn, PLLs are generally considered essential components in communication networking as the generated clock signal is typically used to either transmit or recover the underlying service information so that the information can be used for its intended purpose. PLLs are particularly important in wireless networks as they enable communications equipment to lock-on to the carrier frequency (onto which communications are transmitted) relatively quickly.

The popularity of mobile communications has renewed interest in and generated more attention to wireless architectures and applications. These applications are typically available on various wireless devices or apparatus including pagers, personal digital assistants, cordless phones, cellular phones, and global positioning systems. These applications may be found on networks that transport either voice or data. The popularity of mobile communications has further spawned renewed interest in the design of relatively low phase noise and phase hit free oscillators that are also tunable over a fairly wide frequency range (e.g., broadband tunable). Phase noise at a certain offset from the carrier frequency, frequency tuning range and power consumption are generally regarded as key figures of merit with respect to the performance of an oscillator. Given the relatively low number of active and passive devices in a VCO circuit, however, designing a VCO is generally assumed to be easy. Similarly, optimizing the foregoing figures of merit is generally regarded as straightforward. But constraints on phase noise and broadband tunability are demanding performance metrics that represent tradeoffs between each other. In addition, the need for a phase hit free solution has been in demand for a relatively long time.

More specifically, despite continuous improvement in oscillators/VCOs technology, the requirements of low power consumption, low phase noise, low thermal drift, low phase hits and compact size continue to make the design of VCOs challenging. The dynamic time average Q-factor (quality factor or Q) of the resonator and the tuning diode noise contribution generally set the noise performance of VCOs. The dynamic loaded Q is inversely proportional to the frequency range or tuning band of a VCO. As such, tradeoffs are continually being made between factors that may affect an oscillator's Q-value such as, for example, power, power consumption, noise performance, frequency stability, tuning range, interference susceptibility, physical space, and economic considerations. Most oscillators utilize some form of a transistor based active circuit or element to satisfy trade-off requirements. But transistors add to the complexity of an oscillator's design due to their inherent non-linearities, noise properties and temperature variations.

In that regard, designers are often hesitant to try new oscillator topologies primarily because they are unsure of how they will perform in terms of phase noise, conduction angle, tuning range, harmonic contents, output power etc. As such, most designers have a small number of favorite oscillator circuits that they adapt to meet changing and future requirements.

Traditionally, RF designers typically use LC (Inductor/Capacitor) resonator tank circuits to achieve low phase noise performance. A perfectly lossless resonant circuit is an ideal choice for an oscillator, but perfectly lossless elements, e.g., inductor, capacitors, are usually difficult to make. Overcoming the energy loss implied by the finite Q of a practical resonator with the energy supplying action of an active element is one potentially attractive way to build oscillators that meet design requirements. In order to guarantee stable sustained oscillation, it is usually desirable to maintain a net negative resistance across the LC resonator tank of an oscillator circuit. A negative resistance generated by the active device (3-terminal bipolar/FET) is usually used to compensate for the positive resistance (loss resistance) in a practical resonator, thereby overcoming the damping losses and reinforcing the stable oscillation over the period.

One of the major challenges in the design of a transceiver system is frequency synthesis of the local oscillator signal. Frequency synthesis is usually done using a PLL. A PLL typically contains a divider, phase detector, filter, and VCO. The feedback action of the loop causes the output frequency to be some multiple of a supplied reference frequency. This reference frequency is generated by the VCO whose output frequency is variable over some range according to an input control voltage as discussed above.

Varying the reference frequency of an oscillating signal source is important to second and third generation wireless systems. In fact, the coexistence of second and third generation wireless systems requires multi-mode, multi-band, and multi-standard mobile communication systems, which, in turn, require a tunable low phase noise and low phase hit signal sources. The demand for mobile communication is increasing rapidly and in this system, tunable VCOs are used as a component of a frequency synthesizer, which provides a choice of the desired channel.

A phase hit can be defined as a random, sudden, uncontrolled change in the phase of the signal source that typically lasts for fractions of a second. It can be caused by temperature changes from dissimilar metals expanding and contracting at different rates, as well as from vibration or impact. Microphonics, which are acoustic vibrations that traverse an oscillator package and circuits, can cause a change in phase and frequency. Microphonics are usually dealt with using a hybrid resonance mode in a distributed (micro/strip-line, stripline, suspended stripline) medium.

Phase hits are typically infrequent. But they cause signal degradation in high-performance communication systems. The effect of phase hits increases with data rate. If a phase hit cannot be absorbed by a device (e.g., a receiver) in a communication system, a link may fail resulting in a data loss. As a result, a continuing task is reducing or eliminating phase hits. While phase hits have plagued communication equipments for years, today's higher transmission speeds accentuate the problem given the greater amount of data that may be lost as a result of a phase hit.

Low phase noise performance and wideband tunability have been assumed to be opposing requirements due to the problem of the controlling the loop parameters and the dynamic loaded Q of the resonator over the wideband operation. The resistive losses, especially those in the inductors and varactors, are of major importance and determine the Q of a tank circuit. There have been several attempts to come to grips with these contradictory but desirable oscillator qualities. One way to improve the phase noise of an oscillator is to incorporate high quality resonator components such as surface acoustic wave (SAW) and ceramic resonator components. But these resonators are more prone to microphonics and phase hits. These resonators also typically have a limited tuning range to compensate for frequency drifts due to the variations in temperature and other parameters over the tuning range.

Ceramic resonator (CRO) based oscillators are widely used in wireless applications, since they typically feature very low phase noise at fixed frequencies up to about 4 GHz. CRO resonator-based oscillators are also known for providing a high Q and low phase noise performance. Typically, a ceramic coaxial resonator comprises a dielectric material formed as a rectangle prism with a coaxial opening running lengthwise through the prism and an electrical connector connected to one end. The outer and inner surfaces of the prism, with the exception of the end connected to the electrical connector and possibly the opposite end, are coated with a metal such as copper or silver. A device formed in this manner essentially comprises a resonant RF circuit, including capacitance, inductance and loss resistance that oscillates in the transverse electromagnetic (TEM) mode if loss resistance is compensated.

CRO oscillators, however, have several disadvantages, including a limited operating temperature range and a limited tuning range (which limits the amount of correction that can be made to compensate for the tolerances of other components in the oscillator circuit). CROs are also typically prone to phase hits (due to expanding and contracting at different rates with variation of the temperature for outer metallic body of the CRO and other components of the oscillator circuit).

As such, a circuit designer must typically consider designing a digitally implemented CRO oscillator to overcome the above problems, otherwise, large phase hits can occur. In addition, since the design of a new CRO oscillator is much like that of an integrated circuit (IC), development of an oscillator with a non-standard frequency requires non-recurring engineering (NRE) costs, in addition to the cost of the oscillators.

Thus, a need exists for methods and circuitry that overcome the foregoing difficulties, and improve the performance of an oscillator or oscillator circuitry, including the ability to absorb phase hits over the tuning range of operation.

SUMMARY

In one aspect, the present invention is a voltage controlled oscillator. The oscillator preferably comprises an active device having first, second and third terminals, a biasing circuit coupled to the first terminal and a tuning network coupled to the second terminal. The oscillator further preferably comprises a first resonator coupled to the second terminal in series with the tuning network and a second resonator coupled to the second terminal in parallel with the tuning network.

In accordance with this aspect of the present invention, the first resonator preferably operates at a first resonant frequency and the second resonator preferably operates at a second resonant frequency. In addition, the second resonant frequency is different than the first resonant frequency. The first and second resonant frequency may differ anywhere between a few percentage points and up to a factor of 1000 or more.

In accordance with this aspect of the present invention, the first and second resonators each desirably comprise a lump inductor-capacitor pair. Most preferably, the lumped inductor-capacitor pair of the first resonator comprise a first inductor in series with a first capacitor. It is further preferable that the lumped inductor-capacitor pair of the second resonator comprise a second resonator in parallel with a second capacitor.

Further, in accordance with this aspect of the present invention, the active device preferably comprises an electrical element capable of providing a 180° phase shift between the first and second terminals. Most preferably, the active device is selected from the group consisting of a bipolar transistor and field effect transistors.

Further, in accordance with this aspect of the present invention, the tuning network preferably prefers a tunable voltage source for adjusting the fundamental frequency of operation of the oscillator.

Further still in accordance with this aspect of the present invention, the biasing circuit is coupled between the first and second terminals and feedbacks a select amount of phase noise into the second terminal.

Further, in accordance with this aspect of the present invention, a noise filter is desirably coupled to the third terminal. Most preferably, the noise filter is tunable over the frequency band of the oscillator in response to a change in the tuning voltage.

Further, in accordance with this aspect of the present invention, the first or second resonator may comprise a plurality of lump resonators coupled in parallel to each other.

Further still, the voltage controlled oscillator may further comprise an additional active coupled to the active device in a cascade configuration.

Further in accordance with this aspect of the present invention, the oscillator may include a dynamically tracking filter coupled to the first terminal. As output signal is coupled through the dynamically tracking filter.

In another aspect, the present invention comprises a voltage controlled oscillator. The oscillator preferably comprises a transistor having collector, emitter and base terminals; a first feedback capacitor coupled between the emitter and base terminals; a second feedback capacitor coupled to the emitter terminal; a RF choke inductor coupled in series with a resistor to the emitter terminal; series tuned resonator circuitry coupled to the base terminal; and parallel tuned resonator circuitry coupled to the base terminal.

Further in accordance with this aspect of the present invention, the oscillator further desirably comprises a tuning network coupled to the base terminal through the series tuned resonator circuitry.

In addition, the oscillator may further comprise feedback circuitry coupled between the collector and emitter terminals, the feedback circuitry being operable to feedback a select amount of phase noise appearing at the collector terminal into the base terminal.

In another aspect, the present invention may comprise a communication device. The device preferably comprises a phase lock loop for generating a clock signal used to transmit or recover information communicated from or to the device, wherein the phase lock loop includes a voltage controlled oscillator for generating the clock signal, the voltage controlled oscillator preferably comprising, a transistor having collector, emitter and base terminals; a first feedback capacitor coupled between the emitter and base terminals; a second feedback capacitor coupled to the emitter terminal; a RF choke inductor coupled in series with a resistor to the emitter terminal; series tuned resonator circuitry coupled to the base terminal, the series tuned resonator circuitry having a first resonant frequency; and parallel tuned resonator circuitry coupled to the base terminal, the series tuned resonator circuitry having a first resonant frequency.

The communication device may preferably comprise a wireless device such as cellular phone, personal digital assistant, or laptop or computer.

In another aspect, the present invention desirably allows for a substantial reduction in phase noise by modifying the transfer function of the resonator network. This is achieved by incorporating additional resonance circuitry in the resonator network. In that regard, the transfer function of the parallel mode resonance may be modified by adding series mode resonance shifts to the oscillating frequency of the oscillator circuit that improves the group delay based on the component values of the series tuned resonator network. In this way, the shifted oscillating frequency may substantially coincide with a maximum-slope of the phase curve of the oscillator circuit. The operation of the oscillator circuit about this point results in the circuit operating within the lowest phase noise domain of the phase characteristic curve, thereby improving the effective dynamic loaded Q. This increase in the effective dynamic loaded Q translates directly into reduced phase noise.

BRIEF DESCRIPTION OF THE DRAWINGS

The foregoing aspects of the present invention, as well as details of illustrative embodiments thereof, will be more fully understood by reference to the accompanying figures in which.

DETAILED DESCRIPTION

Figure 1:
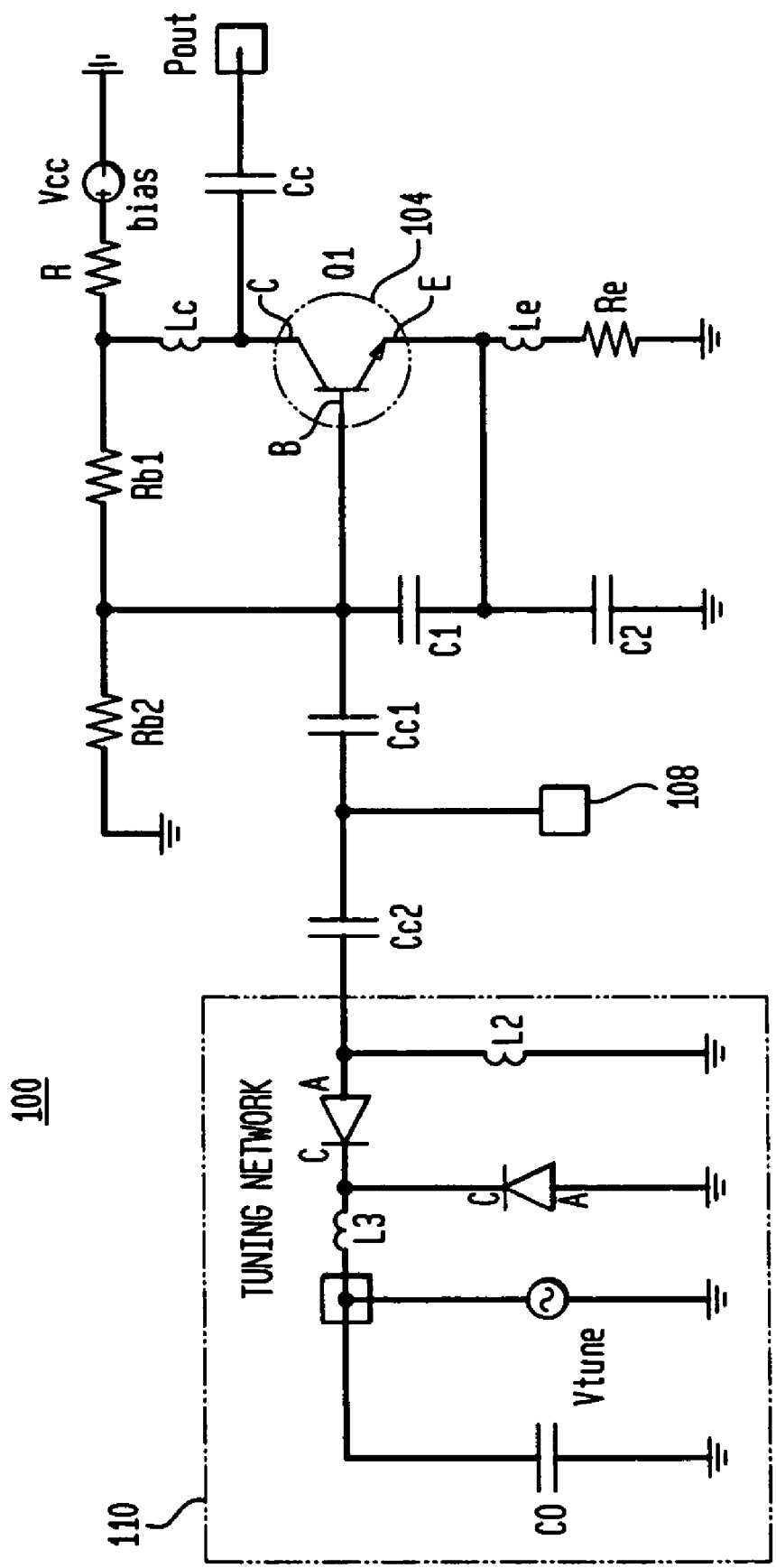
FIG. 1 illustratively depicts a circuit diagram that illustrates a prior art oscillator/VCO operating in parallel resonance mode.

FIG. 1 illustratively depicts a circuit diagram of a prior art Colpitts oscillator 100 operating in parallel resonance mode. The oscillator 100 comprises a transistor 104 having a collector terminal C coupled to a power source Vcc via inductor Lc and resistor Rb0. A first bias resistor Rb1 is coupled between the resistor Rb0 and the base B of the transistor 104. An additional biasing resistor Rb2 is coupled between the base B and ground. A first feedback capacitor C1 is coupled between the base B and emitter E. A second feedback capacitor C2 is coupled between the emitter E and ground. A choke inductor Le and resistor Re are coupled between the emitter E and ground. The biasing resistors Rb1 and Rb2 are used to maintain a biasing voltage at the base B of the transistor 104 during operation of the oscillator. The choke inductor Le essentially removes the resistor Re from the circuit in the terms of the RF spectrum. It should be recognized that the transistor 104 and capacitors C1 and C2 comprise a negative resistance cell of the Colpitts type oscillator.

A parallel tuned resonator 108 is coupled to the base B of the transistor 104 through a coupling capacitor Cc1. A tuning network 110 is capactively coupled to the resonator 108 through capacitor Cc2. In operation, by changing the tuning voltage (Vtune), it is possible to adjust the load impedance on the resonator 108 which results in a change in the frequency of oscillation of the circuit and at the output Pout.

The oscillator circuit of FIG. 1 operates at a relatively low magnitude reactance or large capacitance across the base B and emitter E in an attempt to overcome temperature variations and non-linearities of the transistor 104. Unfortunately, this results in a relatively lower loaded Q factor. In addition, the unloaded Q of the resonator must be increased to compensate for loading. This increases the size or cost of the resonating structure and the device components associated with the circuitry of oscillator 100. As is explained in greater detail below, an oscillator implemented in accordance with an aspect of the present invention may be viewed as a resonator-based Colpitts oscillator where a negative resistance generating active device operates in a voltage or high impedance made rather than a current or low impedance mode.

Figure 2:
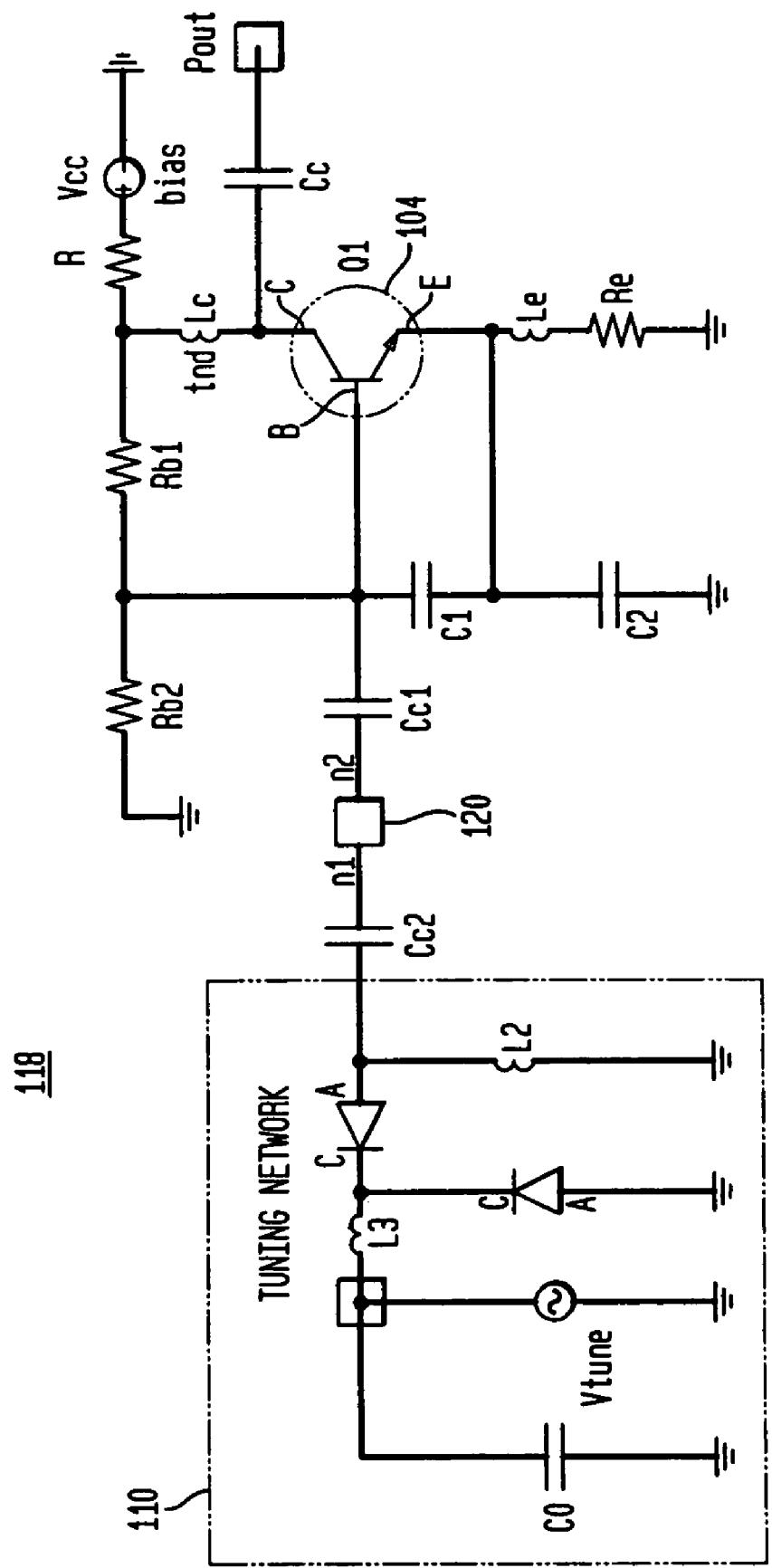
FIG. 2 illustratively depicts a circuit diagram that illustrates prior art oscillator/VCO operating in series resonance mode.

Turning now to FIG. 2, there is depicted a prior art oscillator 118 similar to oscillator 100 of FIG. 1, except that the resonator 120 is series tuned, rather than parallel tuned in FIG. 1. The difference in operation caused by using the series tuned resonator 120 in FIG. 2 is that FIG. 1 works in series resonance mode, whereas; FIG. 2 operate in parallel resonance mode. For example, whereas FIG. 2 provides a wider tuning range, it does so at the cost of degraded phase noise performance. In contrast, the oscillator of FIG. 1 provides a better phase noise performance but does not provide as great a tuning range.

Figure 3:
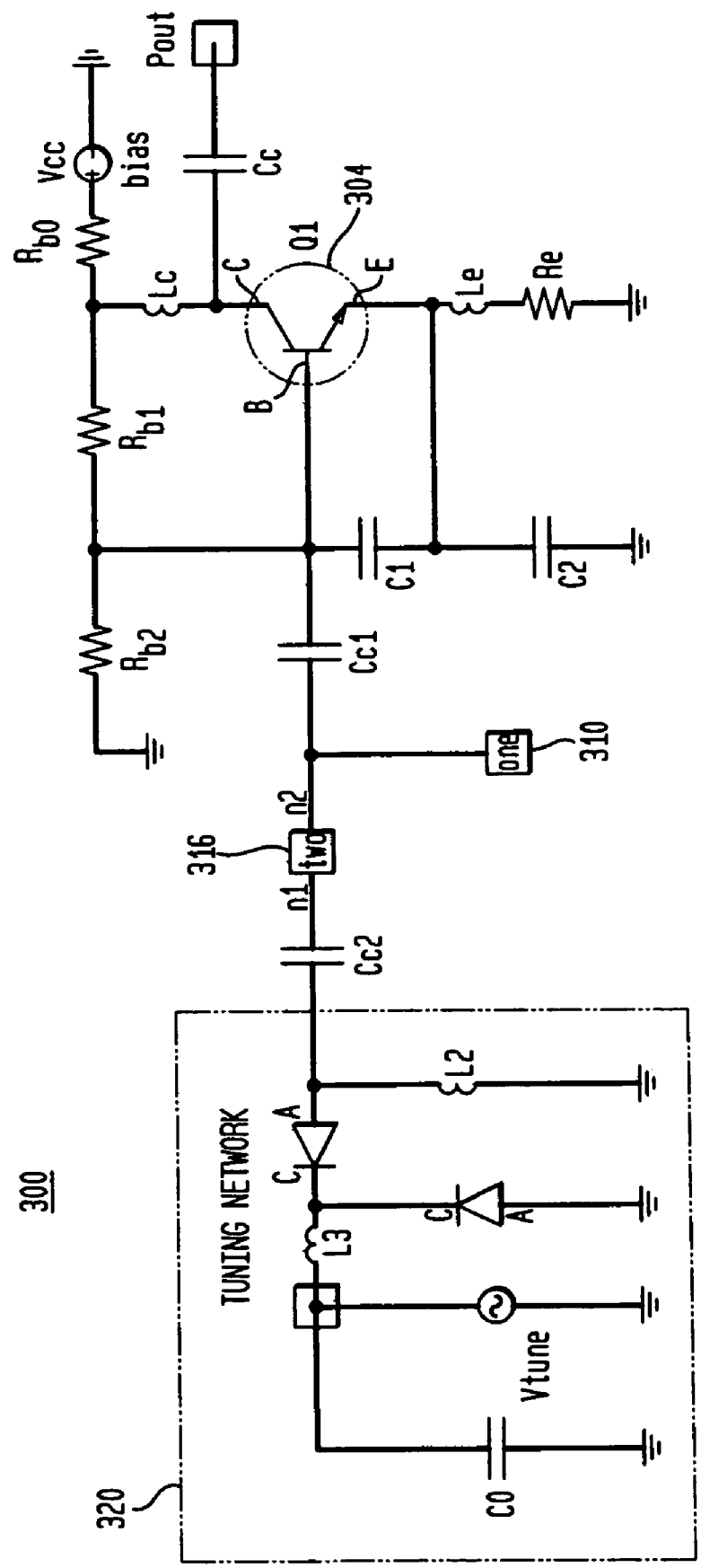
FIG. 3 illustratively depicts a circuit diagram illustrating an oscillator in accordance with an aspect of the present invention.

Turning now FIG. 3, there is shown an oscillator 300 in accordance with an aspect of the present invention. The oscillator 300 comprises a transistor 304 having a collector terminal C, a base terminal B and an emitter terminal E. The collector terminal C is coupled to a power source or rail Vcc through inductor Lc and a resistor Rb0. A first bias resistor Rb1 is coupled between the base terminal B of the transistor 304 and the resistor Rb0. A second biasing resistor Rb2 is coupled between the base terminal B and ground. A pair of negative feedback capacitors C1 and C2 is coupled in series between the base terminal B and ground. As one skilled in the art recognizes, the transistor 304 and capacitors C1 and C2 generally comprise a negative resistance cell of the Colpitts type oscillator.

A choke inductor Le and a resistor Re are connected between the emitter terminal E and ground. As is further shown in FIG. 3, an output signal Pout is capacitively coupled from the collector terminal C of the transistor 304.

A first resonator 310 is coupled in parallel to the base terminal B of the transistor 304 through a first coupling capacitor Cc1. In this way, the resonator 310 is configured to operate in parallel resonance mode. In accordance with an aspect of the present invention, the oscillator 300 also includes a second resonator 316 having a first node n1 and a second node n2. The second node n2 of the second resonator 316 is coupled in series with coupling capacitor Cc1 to the base terminal B of the transistor 304. A tuning diode network 320 is capacitively coupled to the first node n1 of the second resonator 316 via coupling capacitor Cc2. In accordance with this aspect of the present invention, the series tuned resonator 316 causes a change in the phase characteristics of the overall resonator network, which modifies the transfer function of the parallel tuned resonator 310 towards a steeper phase load, thereby increasing the effective Q of the oscillator. The increase in the effective loaded Q translates directly into reduced phase noise. As is discussed in further detail below, phase noise improvement in the range of 6-10 dB has been measured for oscillator circuits operating at 622 MHz, 1000 MHz and 2488 MHz and can be extended to other frequencies as well by appropriate selection of the circuit components.

An oscillator implemented in accordance with the circuit diagram of FIG. 3 can be viewed as a resonator-based Colpitts oscillator where the negative resistance generating active device (e.g., transistor 304) operates in a voltage or high impedance mode rather than a current or low impedance mode. FIG. 3 operates in hybrid resonance mode by incorporating series and parallel resonance mode resonators in such a way that it not only optimizes the noise impedance transfer function but also improves the dominant mode, rate of change of phase and group delay. In particular, the parallel tuned resonator 310 resonates at a frequency f1 and the series tuned resonator 316 resonates at a frequency f2. The difference between f1 and f2, Δf, can be positive or negative depending upon operating frequency, tuning range, harmonic content, harmonic rejection and phase noise. Although the difference in frequency between f1 and f2, Δf, depends on the frequency components chosen, it can differ by as much as few percentage points, tens of percentage points (e.g., 20%), or by a factor of up to 10, 100, etc.

In general, the circuitry of FIG. 3 preferably operates as follows. Once the transistor 304 is properly bias and feedback occurs to create an oscillating condition, the transfer function of the circuit 300 based on the parallel tune resonator 310 is modified by the series tuned resonator network 316 such that the rate of change of the phase is improved with respect to the frequency of oscillation. This effectively improves the group delay, thereby reducing phase noise. More particularly, modifying the transfer function of the parallel mode resonance network 310 by using the series tuned resonance network 316 shifts the oscillating frequency of the oscillator circuit but improves the group delay based on the selection of the component values of the series tuned resonator network 316. Therefore, the shifted oscillating frequency due to the addition of the series mode resonance network 316 substantially coincides with a maximum-slope of the phase characteristic curve of the oscillator circuit. The operation of the oscillator circuit about this point results in the circuit operating within the lowest phase noise domain of the phase characteristic curve, thereby improving the effective dynamic loaded Q. This increase in effective dynamic loaded Q translates directly into reduced phase noise. The Q factor is given by:

$$Q = \frac{\omega_0}{2}\left[\frac{\partial \varphi}{\partial \omega}\right];$$
$$\omega_0 = 2\pi f_0,$$

where $f_0$ and $\varphi$ are, respectively, the resonant frequency and phase of the oscillator signal.

Figure 4:
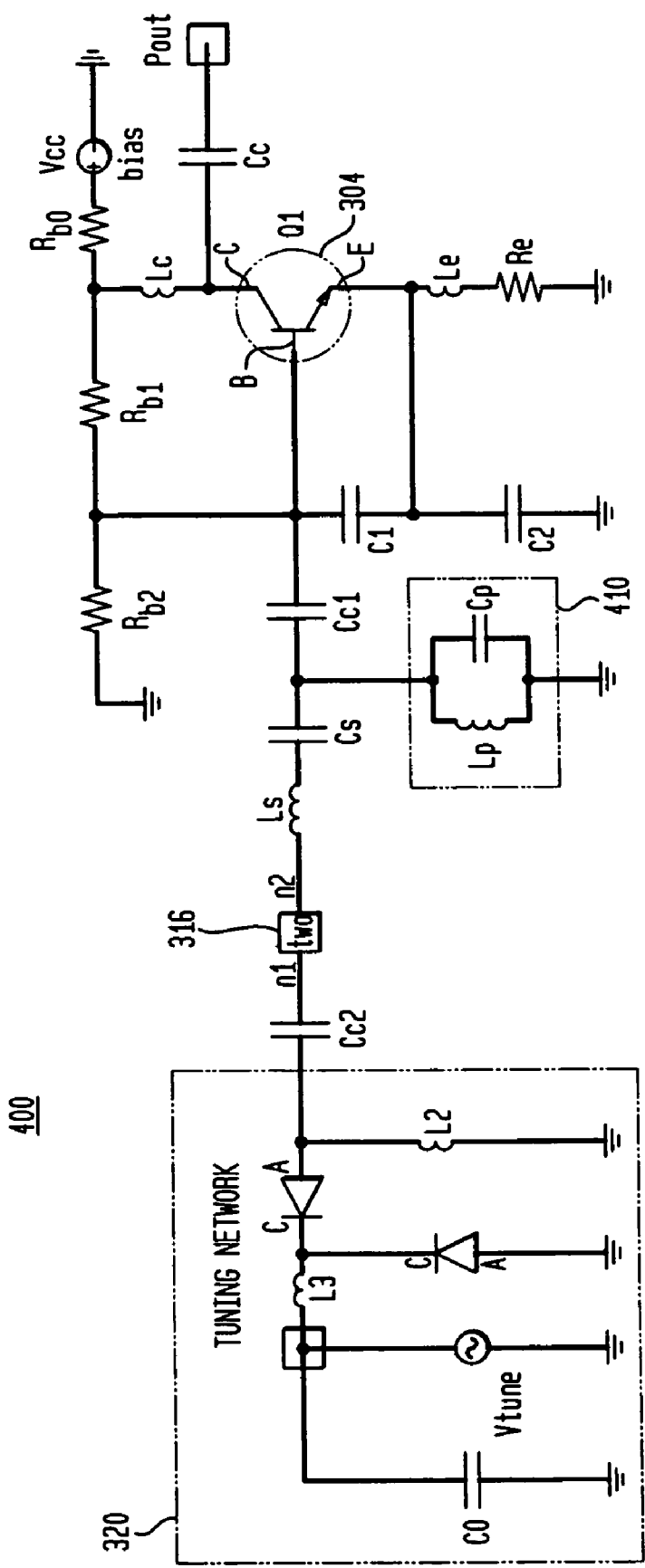
FIG. 4 illustratively depicts a circuit diagram illustrating an oscillator in accordance with an aspect of the present invention.

Turning now to FIG. 4, there is illustrated a circuit diagram of an oscillator 400 in accordance with the further aspect of the present invention. The oscillator 400 is similar to the oscillator shown in FIG. 3, except that the oscillator 400 includes a parallel resonance mode resonator 410 that is comprised of lump elements. As shown, the resonator 410 comprises an inductor Lp and a capacitor Cb in parallel. The circuit also further includes an additional series coupling capacitor Cs between the second mode and two of the series resonance motor resonator 316 and the coupling capacitor Cc1. The incorporation of the series tuned network lowers the loading of the parallel tuned resonator 410 and vice versa, depending upon the oscillator mode of operation (series tuned or parallel tuned). Using circuit simulation techniques the oscillator circuit of FIG. 3 was modified by adjusting the values of Ls and Cs of the series tuned network so that the oscillator resonant frequency substantially coincides with the maximum-slope infection point of the phase characteristics curve. Operation of the oscillator circuit about this point typically results in the circuit operating within the lowest phase-noise region of the curve in comparison with either the independently series tuned or parallel tuned mode of oscillation (e.g., as shown in FIGS. 1 and 2).

Figure 5:
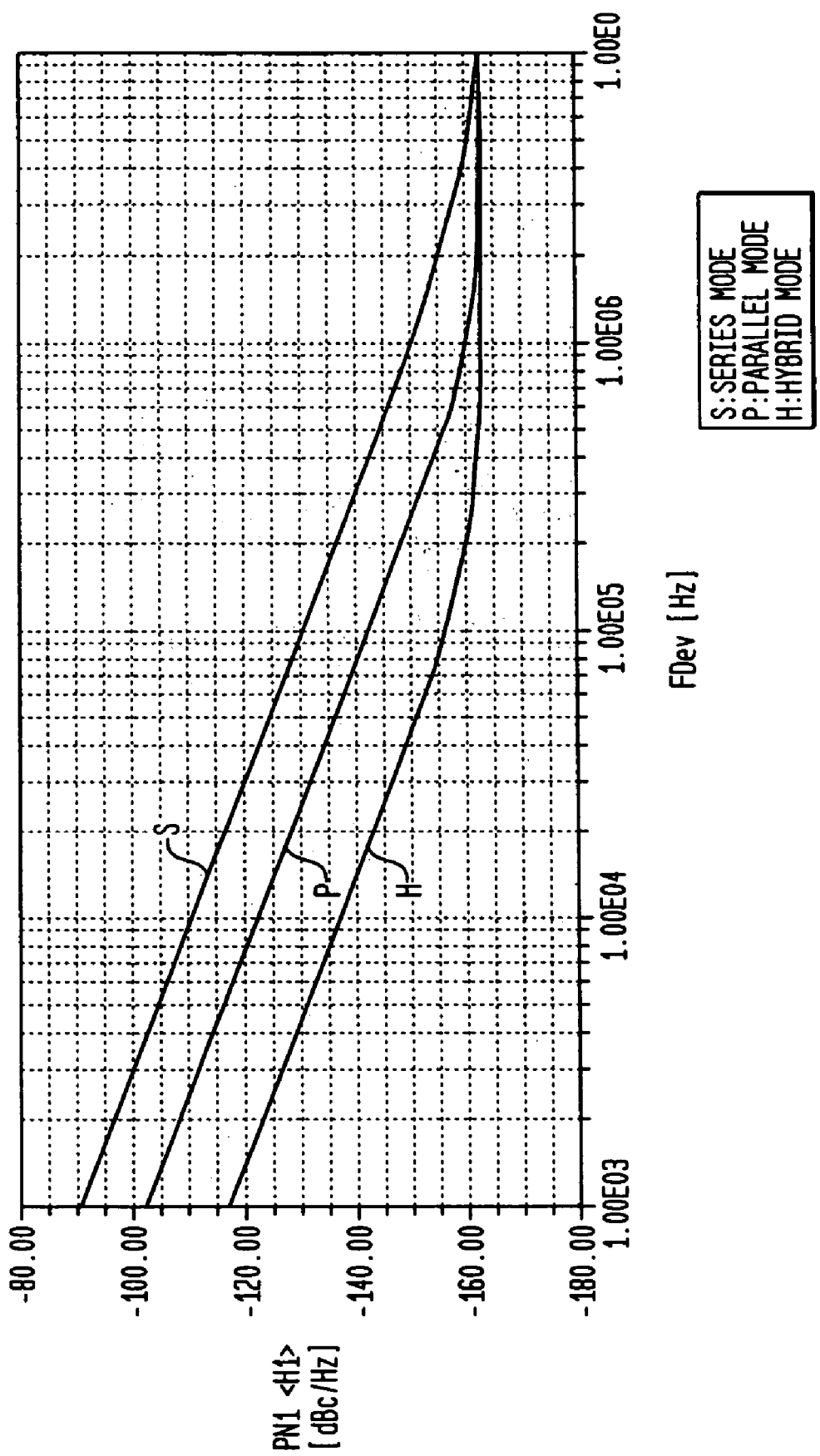
FIG. 5 illustratively depicts a simulated phase noise plot of a prior art oscillator (e.g., FIGS. 1 and 2) along with an oscillator implemented in accordance with the present invention (e.g., FIG. 3).

Turning now to FIG. 5, there is shown simulated phase noise plots of prior art oscillators (e.g., FIGS. 1 and 2) along with an oscillator implemented in accordance with the foregoing aspects of the present invention (e.g., FIG. 3). As shown, the components of the circuit elements shown in FIGS. 1, 2 and 3 were selected such that the circuitry oscillates at approximately 622 MHz (e.g., SONET OC-12 signal rate). The curve labeled S corresponds to operation of a series mode resonator as shown for example in FIG. 2. The curve labeled P depicts the performance of a parallel mode resonator as shown for example in FIG. 1. The curve labeled H depicts the performance of a hybrid tuned resonator oscillator in accordance an aspect of the present invention as shown for example in FIG. 3. As is shown in FIG. 5, the performance of the hybrid-mode resonator oscillator result in improvement of the phase noise performance of the oscillator 30 as compared to the oscillators 100, 118.

Figure 6:
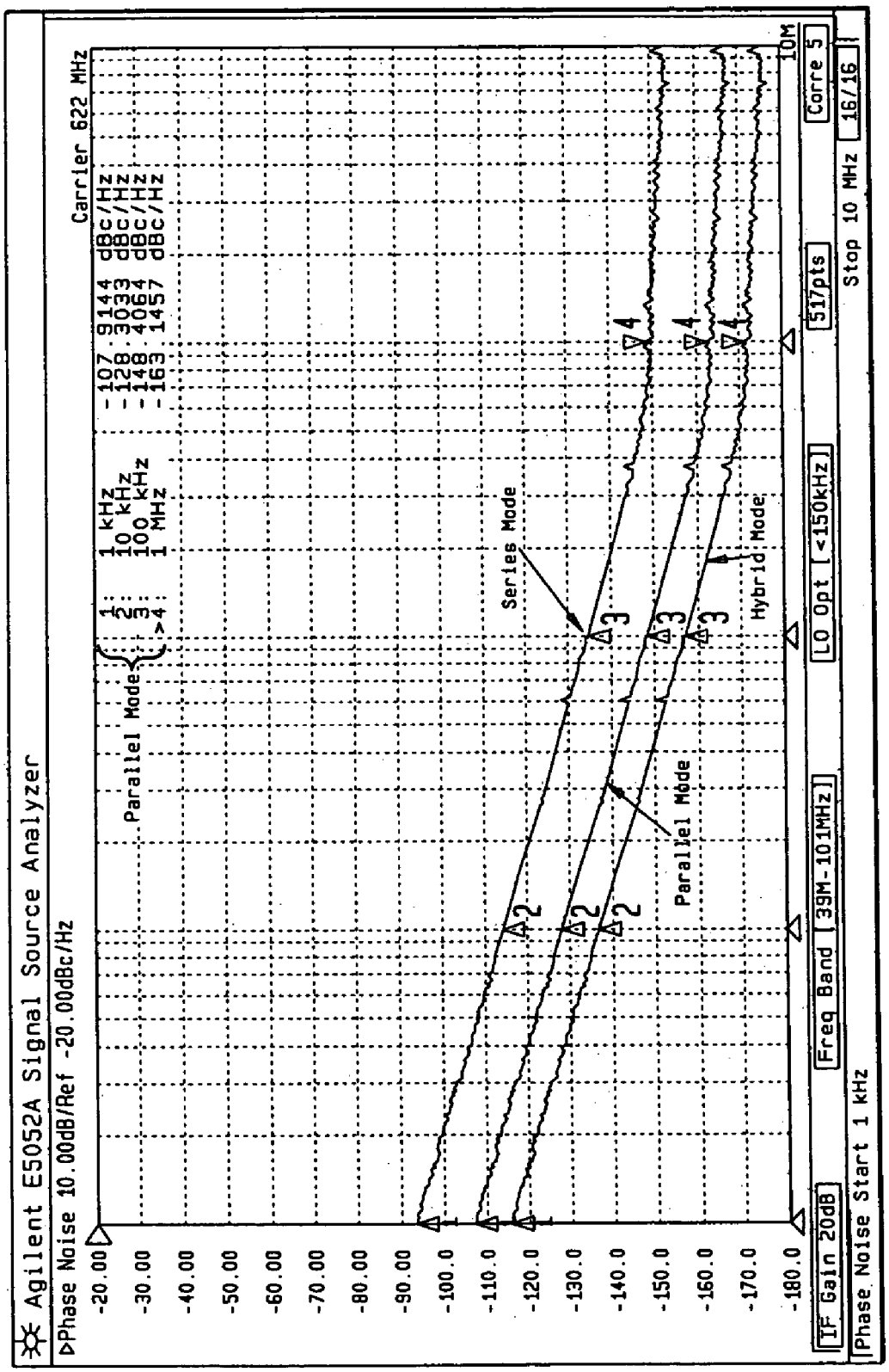
FIG. 6 illustratively depicts a measured phase noise plot of a prior art oscillator (FIGS. 1 and 2) along with an oscillator implemented in accordance with an aspect of the present invention (e.g., FIG. 3).

Turning now to FIG. 6, there is shown a comparison of the measured phase noise plot of the prior art resonators as shown for example in FIGS. 1 and 2, along with a hybrid mode resonator oscillator implemented in accordance with the foregoing aspects of the present invention (e.g., FIG. 3). As FIG. 6 shows, the measured phase noise was anywhere from 6 to 10 db better for a hybrid mode resonator oscillator implemented in accordance with the aspects of the present invention as compared to those of the prior art. The phase noise plots of FIG. 6 were measured on circuits in which components were chosen so that the frequency of oscillation was approximately 622 MHz. As one skilled in the art would recognize, the circuit elements of the foregoing oscillators may be chosen that the frequency of the circuit can oscillate at frequencies other then 622 MHz. In addition, the tuning network may be used to tune the frequency of oscillation over a tuning band.

Figure 7:
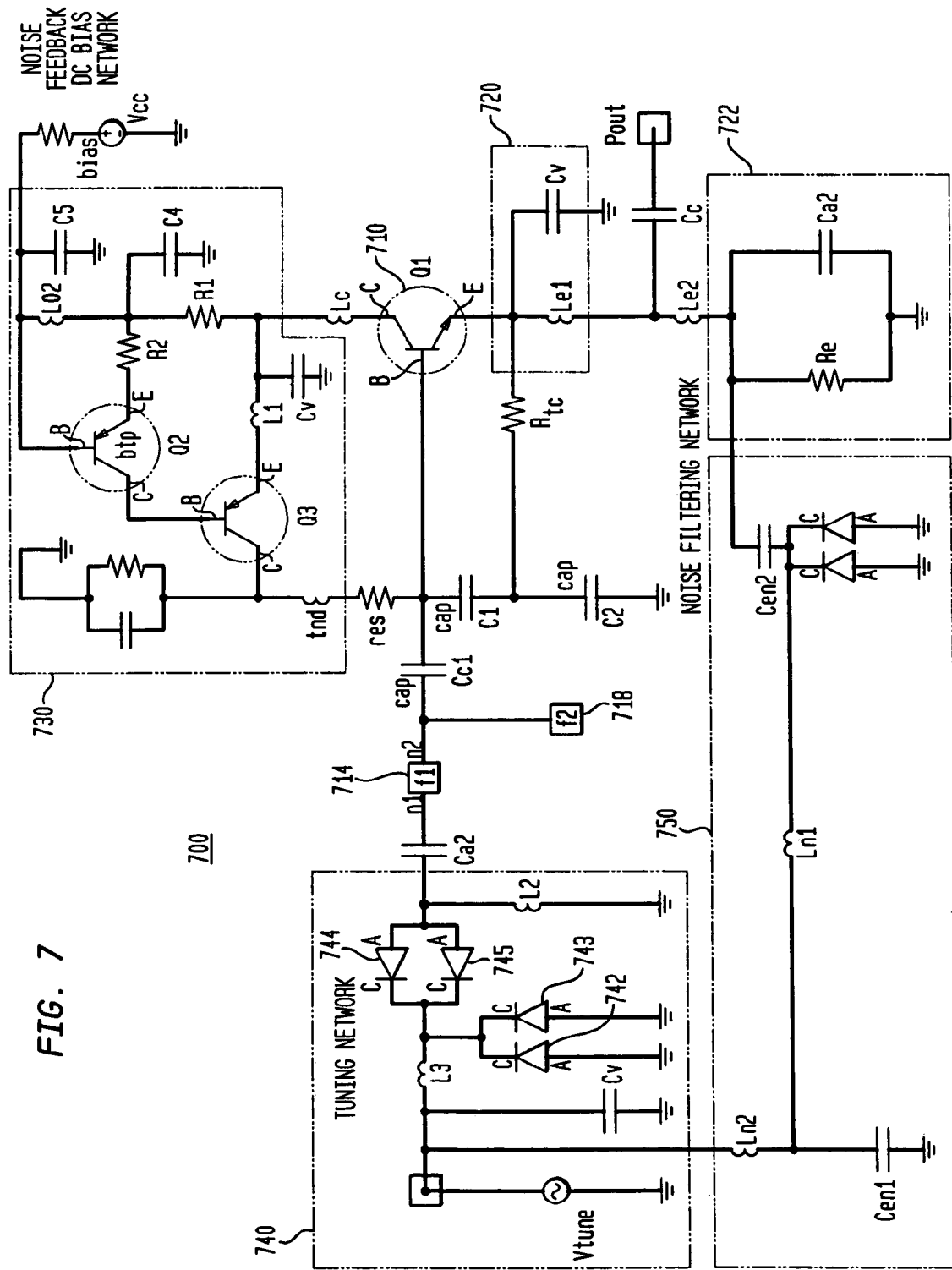
FIG. 7 illustratively depicts a circuit diagram of an oscillator/VCO in accordance with an aspect of the present invention.

Turning now to FIG. 7, there is shown an oscillator 700 in accordance with an additional aspect of the present invention. The oscillator 700 preferably includes a transistor 710 having a collector terminal C, a base terminal B and an emitter terminal E. The oscillator 700 also includes first and second feedback capacitors C1 and C1 connected in series between the base B of the transistor 710 and ground. A series tuned resonator 714 and a parallel tuned resonator 718 are coupled to the base terminal B as shown.

A temperature compensating resistor Rtc is coupled between emitter terminal E and the feedback capacitors C1, C2. The resistor Rtc is generally used to compensate for thermal drift during operation of the oscillator. Two stage filtering is provided at the emitter terminal E via a first filter 720 and a second filter 722. The first filter 720 preferably comprises an LC filter and the second filter 722 preferably comprises a RC filter as shown. Together the first and second filters 720 and 722 are operable to provide two stage regenerative filtering, which reduces the noise spectral density of the transistor 710.

A noise feedback and DC bias network 730 is coupled between the collector terminal C and the base terminal B of the transistor 710. The noise feedback and DC bias network 730 is operable to keep the bias voltage appearing at the collector C constant. As such, temperature variations that may occur and cause the bias voltage to change during operation of the oscillator 700 tend not to influence the operation of the transistor 710 and, therefore, the oscillator 700. In the preferred embodiment, the noise feedback and DC bias network 730 includes one or more transistors, such transistors 732, 733. These transistors 732, 733 and the arrangement of the other circuit elements comprising the network 730 feedback a select amount of phase noise present at the collector terminal C into the base terminal B. As the bias condition of the transistor 710 changes due to a change in the operating temperature, the network 730 adjusts the phase noise fed back to the terminal B and in this way compensates for changes in temperature.

The oscillator 700 further includes a tuning network 740. The tuning network 740 includes a tuning voltage source Vtune. Changing the voltage of Vtune changes the oscillating frequency of the circuit 700 and the signal appearing at Pout. The tuning network 740 also includes a pair capacitor Cv coupled in parallel with first and second diodes 742, 743 across inductor L3. A third diode 744 and fourth diode 745 are coupled in parallel between the inductor L3 and inductor L2 as shown. A noise filtering network 750 is coupled across the tuning network 740 and the filter 722.

The oscillator 700 operates in accordance with the hybrid mode principles described above but includes the additional features of temperature compensation via the network 730 and resistor Rtc. The oscillator 700 further advantageously includes two stage regenerative filtering and a noise filtering networks as discussed above. These additional features serve to improve the noise performance of the oscillator 700 versus those shown in FIGS. 3 and 4.

Figure 9:
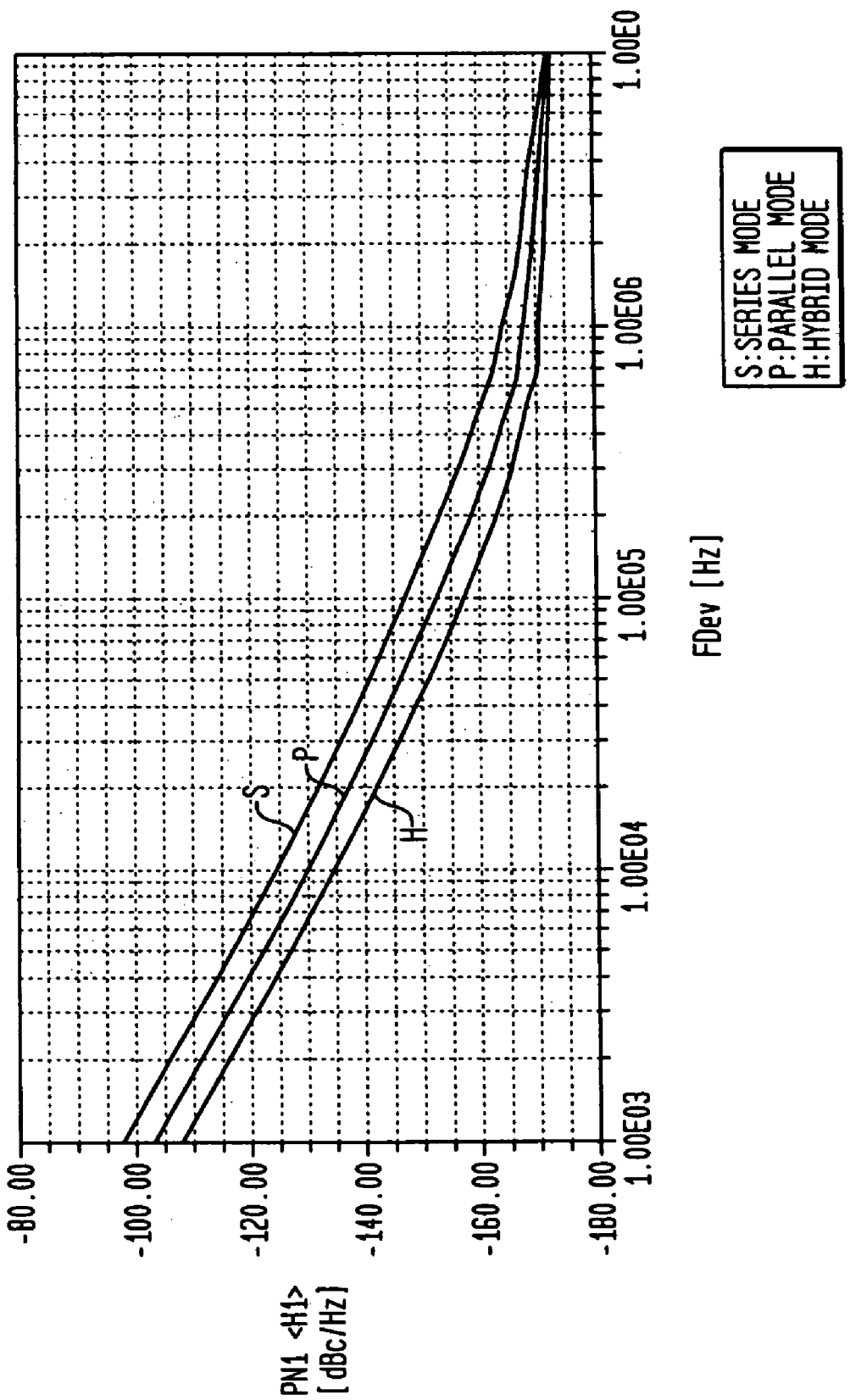
FIG. 9 illustratively depicts a simulated phase noise plot of an oscillator/VCO in accordance with the prior art and the present invention.
Figure 10:
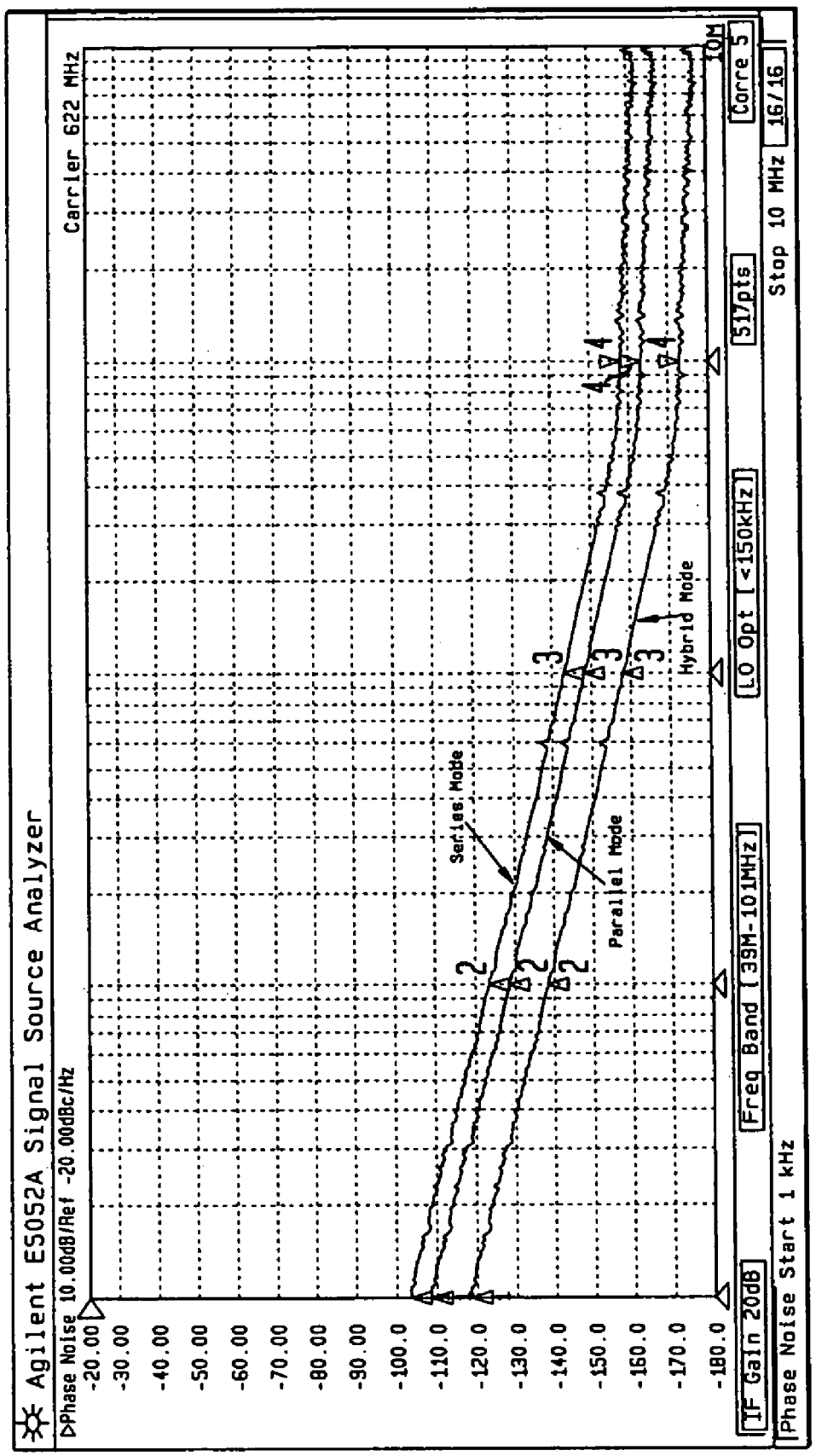
FIG. 10 illustratively depicts a measured phase noise plot of an oscillator/VCO in accordance with an aspect of the present invention along with a prior art oscillator.

FIG. 7 operates in a dynamically controlled dual resonance mode by incorporating a hybrid resonance and noise filtering network in such a way that the noise impedance transfer function for a wide tuning range is optimized. As such, it provides user definable low noise signal sources for different frequency bands in comparison to a fixed phase hits sensitive ceramic/SAW resonator based VCOs, which are known to be generally expensive. The series resonance block 714 provides better tuning range at the cost of loading thereby degrading the phase noise performance. The block 718 operates in a parallel resonance mode thereby providing low phase noise performance at the cost of a limited tuning range. Although by combing blocks 714 and 718 better tuning range may be achieved along with low phase noise performance, it is achieved only for fixed frequencies. By adding the filtering block 722 in conjunction with blocks 714 and 718, the oscillator 700 provides greater tuning range and minimum phase noise performance and improved harmonic rejection. For example, FIGS. 6, 9 and 10 show the phase noise performance for the different modes (series, parallel and hybrid). By dynamically controlling Δf (f1−f2; where f1 is the resonant frequency of block 718 and f2 is the resonant frequency of block 718) dynamically the frequency of operation can be extended without significantly compromising on output power and phase noise performance. Therefore, FIG. 7 shows a user-definable phase hit insensitive oscillator circuit that provides improved phase noise performance in comparison to the individual series resonance mode or parallel resonance, which is usually done using expensive CROs or SAWs.

Figure 11:
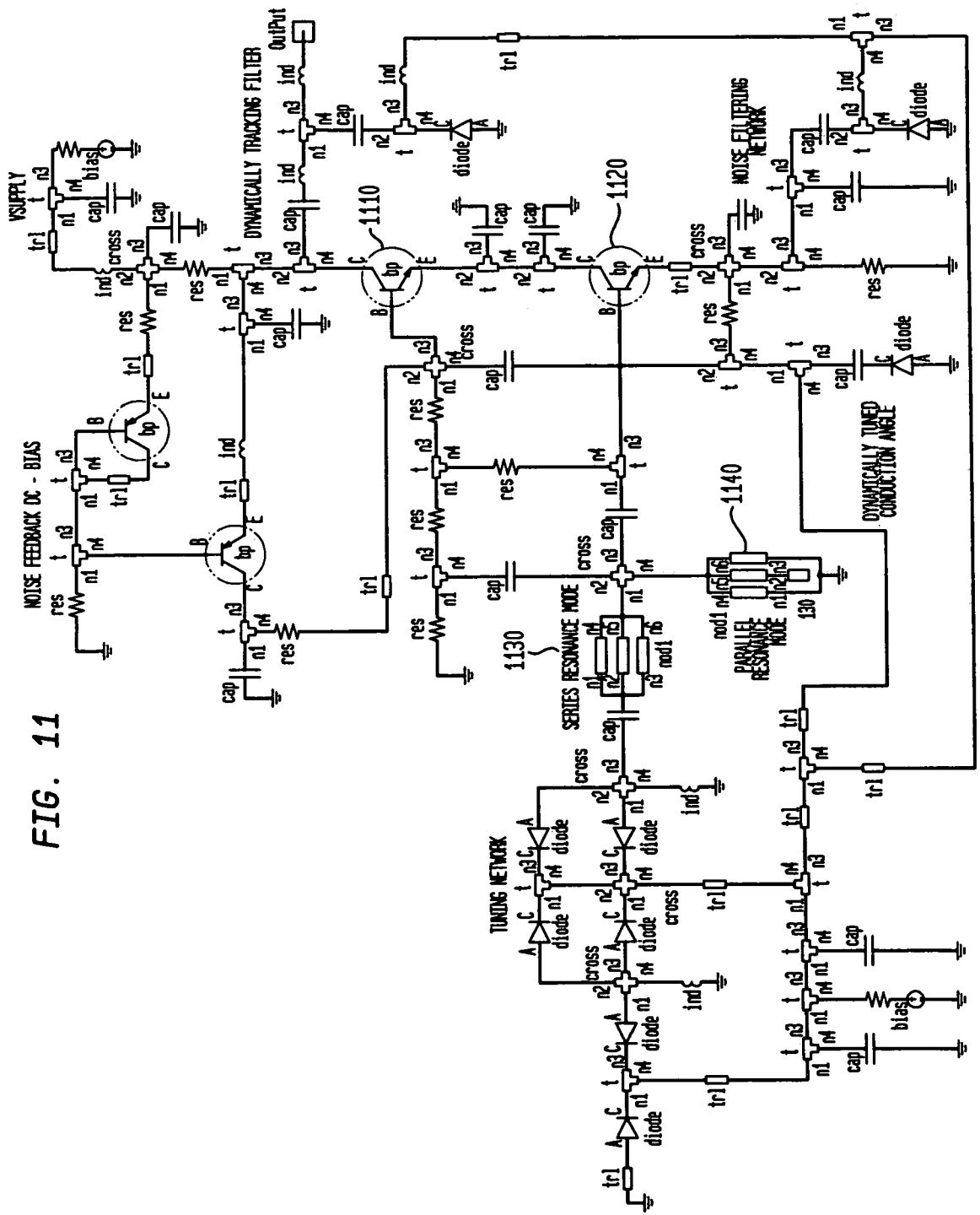
FIG. 11 illustratively depicts a circuit diagram of an oscillator/VCO in accordance with an aspect of the present invention.

An additional advantage of hybrid resonance mode is that thermal drift (change in oscillating frequency due change in operating temperature and other parameters) may be significantly minimized by optimizing delta f either positively or negatively, depending on temperature gradient. For example, depending on the temperature gradient delta f may be positive, negative or zero. An aspect of the present invention is also that by using two low Q resonators in a planar domain such 714, 718 (or as shown in FIG. 11, 1130, 1140) provides high Q resonance, the required tuning range result in low cost, power efficient oscillator that can replace discrete expensive, bulky CRO or SAW resonator while providing better phase noise performace. Such performance is depicted is in FIG. 12 for example.

Figure 8:
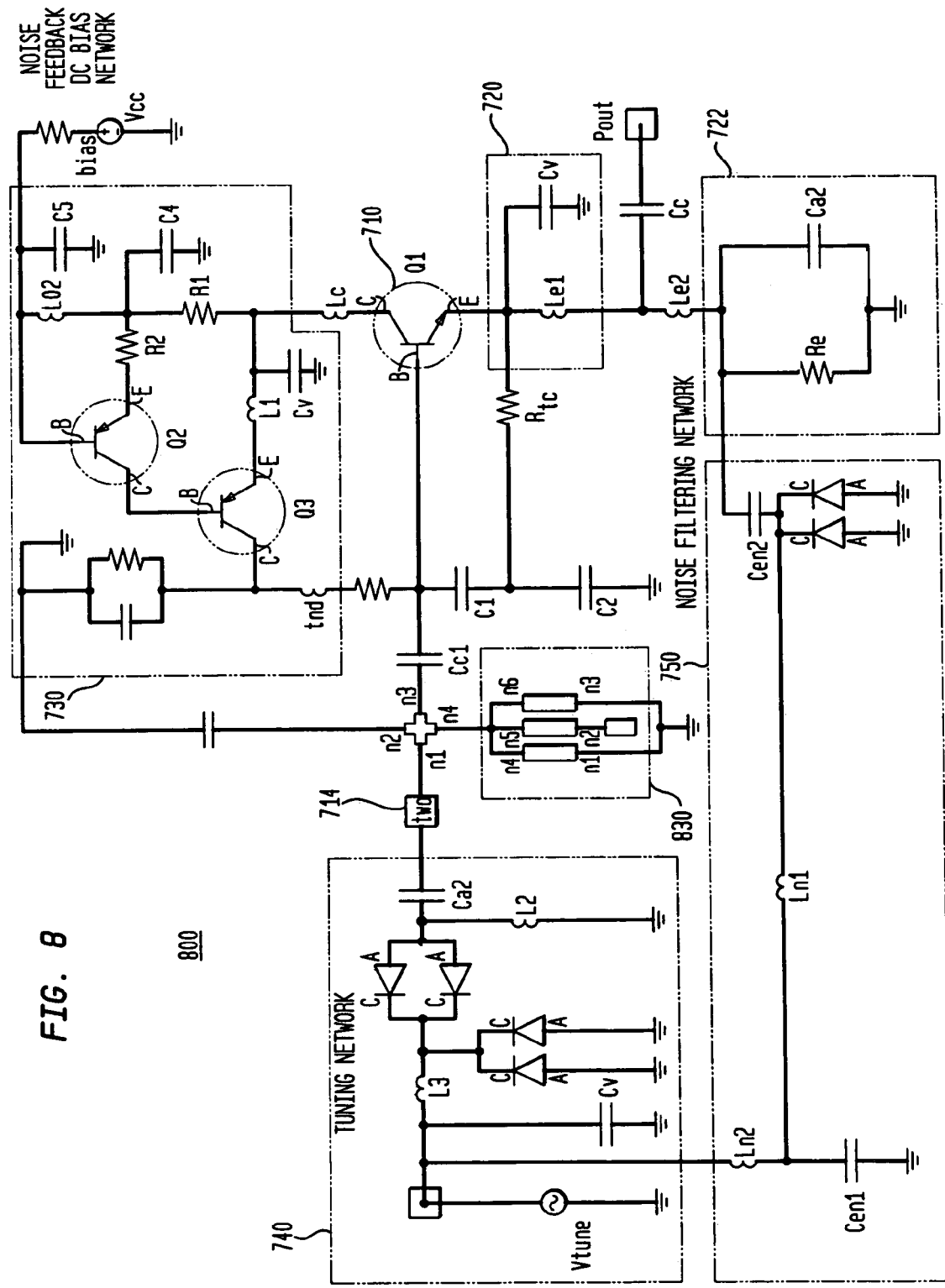
FIG. 8 illustratively depicts a circuit diagram of an oscillator/VCO in accordance with an aspect of the present invention.

Turning now to FIG. 8, there is shown an oscillator 800 in accordance with an additional aspect of the present invention. The oscillator 800 includes for the most part the same functional blocks as shown in FIG. 7. In that regard, those blocks have been labeled as shown in FIG. 7 where appropriate. In FIG. 8, however, the parallel tuned oscillator 830 comprises a printed coupled resonator in a distributed domain such as mirco-stripline, stripline or suspended stripline. Stripline technology generally refers to a specific transmission line on a PCB where the signal trace is buried within the PCB and is spaced above and below a ground plane by the dielectric material, such as FR-4 or Roger material. Micro-stripline generally refers to a planar waveguide fabricated in a similar manner to an integrated circuit, or even printed onto a substrate. Suspended-stripline is similar in structure to ordinary stripline, but instead of disposing a ground plane on the dielectric substrate, as in stripline, the dielectric substrate is suspended in space, usually in air, between two ground planes. By replacing the lumped resonator with a resonator in distributed domain, the time average loaded Q is improved and the oscillator becomes less prone to phase hits.

FIG. 9 depicts the simulated phase noise performance of the two prior art oscillator of FIGS. 1 and 2 as compared to an oscillator of FIG. 7. As before, the curve labeled S is for a series mode resonator, P is for a parallel mode resonator and H is for a hybrid mode resonator as shown in FIG. 7. FIG. 10 shows the measured phase for such circuits. The results shown in FIGS. 9 and 10 were for oscillators where the circuit components were chosen so that the circuit operates at approximately 1000 MHz.

Figure 12:
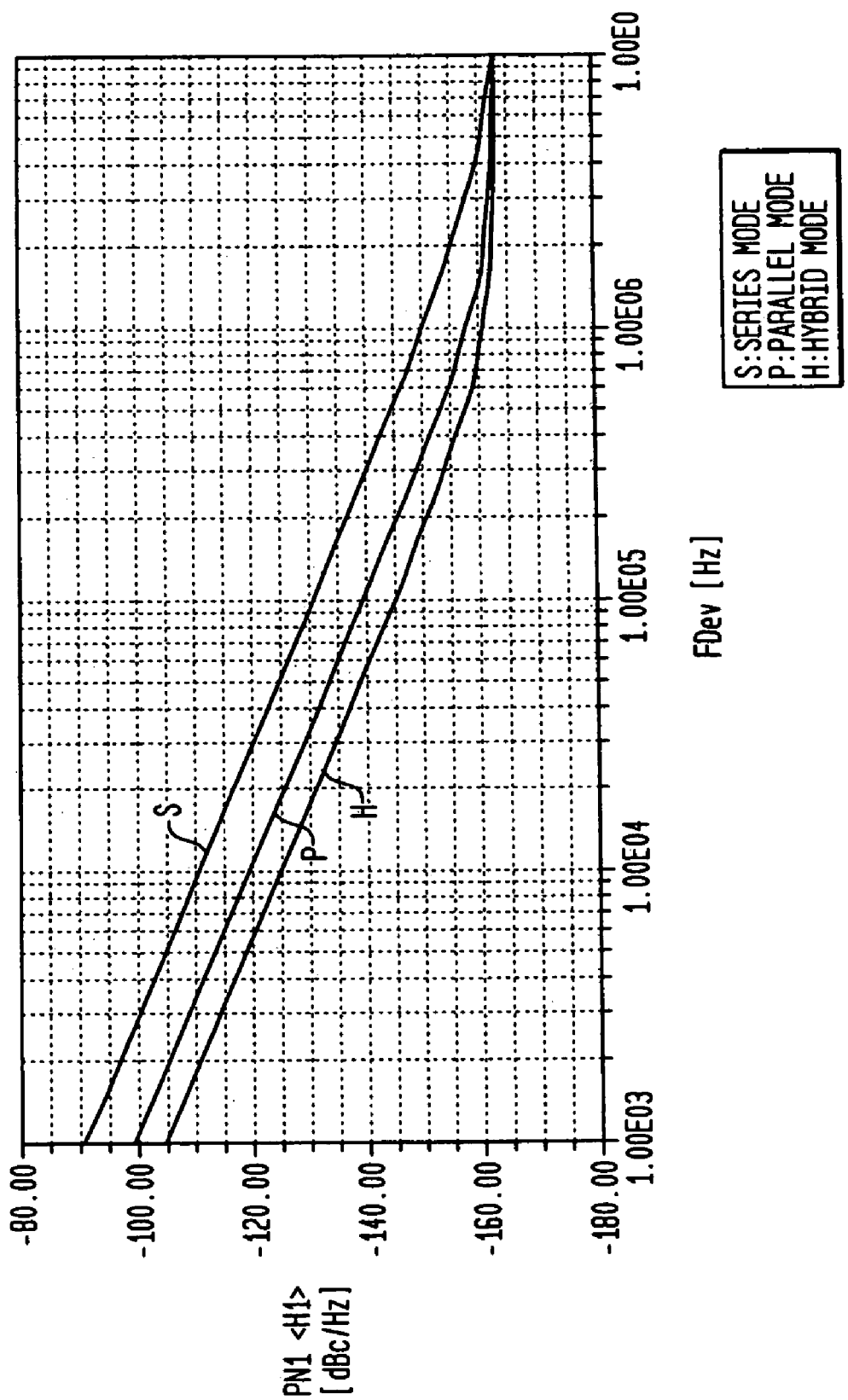
FIG. 12 illustratively depicts a simulated phase noise plot of an oscillator/VCO in accordance with an aspect of the present invention.
Figure 13:
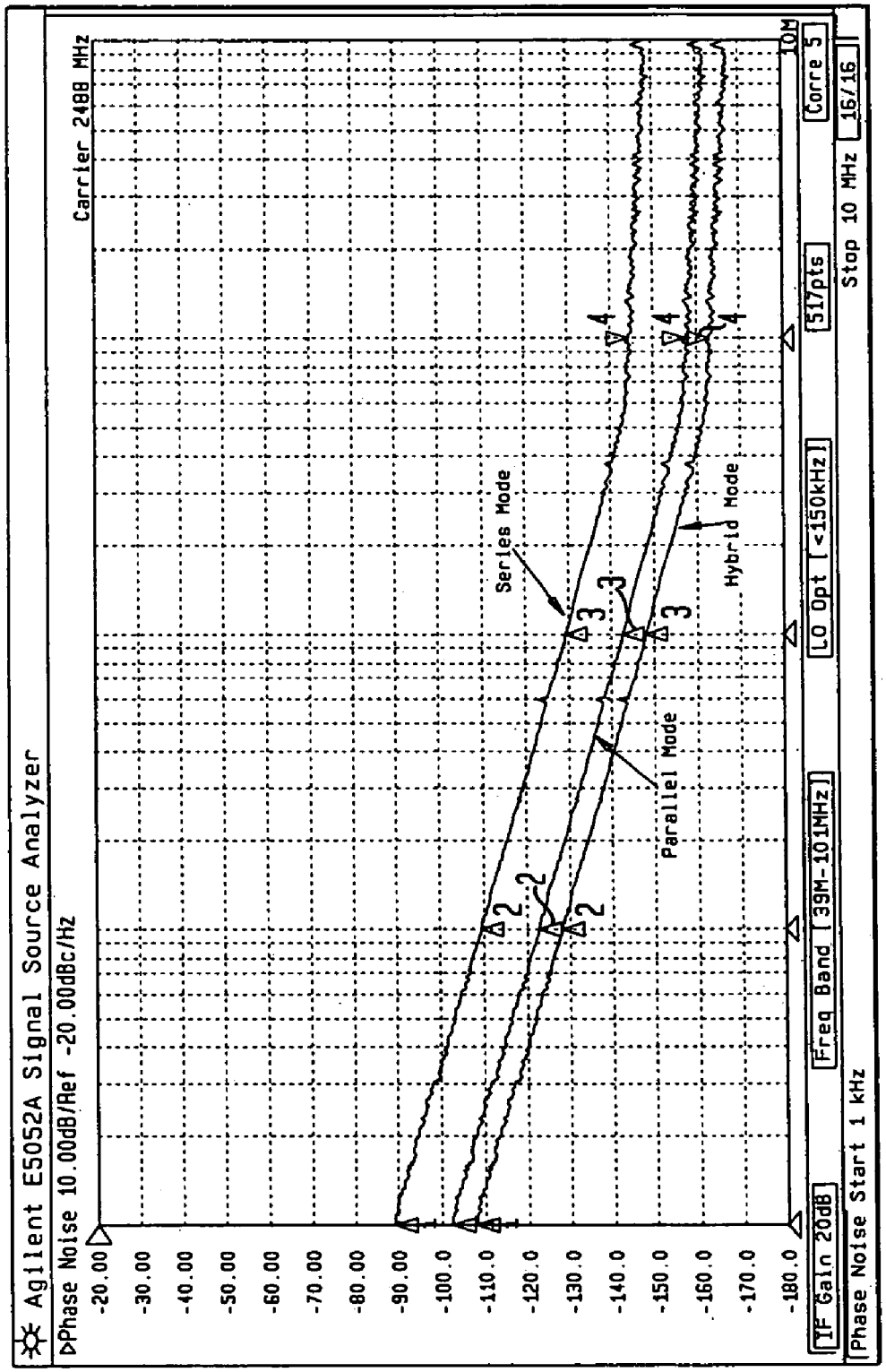
FIG. 13 illustratively depicts a measured phase noise plot of an oscillator/VCO in accordance with an aspect of the present invention.

FIG. 11 is a circuit diagram illustrating an oscillator in accordance with an additional aspect of the present invention. The oscillator of FIG. 11 includes two transistors 1110, 1120 arranged in a cascade configuration along with a noise feedback bias circuitry, a dynamic tracking filter at the output (which is taken from the collector), a dynamically tuned conduction angle, noise filtering and integrated coupled resonators 1130, 1140. The resonators 1130, 1140 may be implemented in stripline, micro-stripline or suspended stripline as discussed above. FIGS. 12 and 13 depict the performance of a 2.488 GHz oscillator implemented in accordance with the present invention as compared to the performance of prior art oscillators operating at the same frequency.

In one aspect, the present invention provides a method and system to reduce and/or eliminate phase hits that may occur in an oscillator without sacrificing the phase noise performance and the tuning range of the oscillator. The oscillator is based on a topology that supports fast convergence by using a dynamically tuned distributed coupled resonator/inductor for optimum noise performance over the frequency band.

In accordance with another aspect of the present invention, the circuit topology and layout of the resonator is selected in such a way that it supports uniform negative resistance over the tuning range. In addition, the high Q resonator (SAW or Ceramic resonator) is preferably replaced by a printed coupled resonator in a distributed domain (microstrip line, stripline, suspended stripline). This results in relative improvement in the time average loaded Q when compared to an uncoupled lumped or distributed resonator. Furthermore, such a resonator is typically less prone to phase hits (printed planar coupled resonators are free from ceramic material, which is prone to phase hits) over the tuning range.

In accordance with this aspect of the present invention, distributed coupled resonators (DCRs), which are depicted much like a high Q planar resonator in an equivalent circuit, can achieve the phase-noise performances of a CRO oscillator but over a wider tuning and operating temperature range at a lower cost. They may be made small compared to CROs/SAWs, especially at frequencies of 1000 MHz and less, and can be readily designed at standard and custom frequencies up to about 10 GHz without expensive NRE costs.

Although a lumped or printed coupled resonator tends to occupy a larger area on a printed circuit board (PCB) and for the same space exhibit much lower Qs as compared to a CROs, these disadvantages are overcome by means of the DCR topology in accordance with a further aspect of the present invention. The DCR topology acts as a Q-multiplier, which employs a hybrid resonance mode, a regenerative noise filtering network, and noise feedback bias circuit. The noise feedback circuit is incorporated in the topology to reduce thermal drift over a wide temperature range. In addition, the mode coupling approach includes a methodology for the DCR to enhance the dynamic loaded Q, and to reduce or eliminate phase hits, while reducing the susceptibility to microphonics to an extremely low level, and retaining low phase noise and broadband tunability.

In another aspect, the present invention provides an apparatus and method for increasing the Q value of a printed planar resonator by cascading a plurality of units, which include a passive frequency selective circuit such as distributed coupled resonators having multiple coupled lines to obtain an oscillator exhibiting a relatively high Q resonator in comparison to uncoupled printed resonators.

In accordance with this aspect of the present invention, a plurality of distributed resonators are cascaded or concatended to increase the phase derivative, or group delay [$\delta\phi/\delta\omega$] of the resonator. Thus, the phase condition of the oscillator circuit occurs in the steepest part of the phase characteristics of the resonator. In addition, modifying the transfer function of the parallel mode resonance by introducing a series tuned resonance shifts the oscillating frequency of the oscillator circuit but improves the group delay based on the selection of the component values of the series tuned resonator network. Therefore, the shifted oscillating frequency due to the addition of the series mode resonance may substantially coincide with a maximum-slope of the phase characteristic curve of the oscillator circuit. The operation of the oscillator circuit about this point results in the circuit operating within the lowest phase noise domain of the phase characteristic curve, thereby improving the effective dynamic loaded Q. This increase in effective dynamic loaded Q translates directly into reduced phase noise. The Q factor is given by $$Q = \frac{\omega_0}{2}\left[\frac{\partial\varphi}{\partial\omega}\right];$$
$$\omega_0 = 2\pi f_0,$$

where $f_0$ and $\phi$ are, respectively, the resonant frequency and phase of the oscillator signal.

An oscillator implemented in accordance with this aspect of the present invention may be readily and advantageously employed without otherwise sacrificing component size or other economic consideration. Hence, an aspect of the present invention, in furtherance of satisfying a long-felt and growing need in the field, facilitates an oscillator having relatively low phase hits for a given physical size along with other attributes known to be desirable in the art.

Recent trends have seen the desire for a low phase noise and low phase hit oscillator. As discussed above, phase hits are generally attributable to microphonic noise and its associated circuitry. Circuitry that reduces the microphonic noise will typically reduce the phase hits associated with such circuitry. Lower microphonics noise generally means that the resonator network should be free from ceramic material. The present invention discloses a topology for providing a low phase noise and minimum phase hits when compared to the ceramic and SAW resonator based oscillators. The topology is based on a hybrid resonance network, which improves the loaded Q of the lumped or printed resonator tuned in parallel resonance mode by incorporating a series resonance mode network. In one aspect, the topology of the invention preferably eliminates the use of ceramic material in the oscillator circuit, thereby allowing the oscillator circuit to be operated in a relatively low Q environment at a higher oscillation frequency. This provides a wider tuning range than a CRO based oscillator circuit without compromising the phase noise performance.

Improvements in phase noise performance that typically require a higher Q resonator circuit, such as SAW and CRO resonators, may be obtained in accordance with the foregoing aspects of the present invention by incorporating an additional series resonance tuning network into the parallel tuned oscillator circuit. This allows the steepest phase region to coincide with a maximum-slope inflection point of the phase characteristic curve. This leads to improvement of loaded Q that translates directly into reduced phase noise. The improvement obtainable using the technique of the present invention is typically in the range of 6-10 dB.

In a preferred embodiment, an oscillator is provided that includes a resonant structure selected to resonate at a frequency, and an active device coupled in parallel to the resonant structure. The active impedance created by the active device includes a negative real part with a real magnitude and an imaginary part with an imaginary magnitude. The real magnitude is a function of the imaginary magnitude and the imaginary magnitude is selected such that the real magnitude compensates for the losses in the resonator while coinciding with a maximum-slope inflection point of the phase characteristic curve for improved group delay. The resonator structure is, preferably, a resonator such as a lumped resonator, which preferably comprises a parallel inductance and capacitance or printed resonator in a distributed medium (microstrip line, stripline, suspended stripline etc.).

In another aspect of the present invention, the resonant structure is selected to have a parallel resonant frequency that is below the desired or nominal operating frequency of the oscillator. By incorporating a series tuned resonator network in conjunction with a parallel tuned resonator network the impedance level at the oscillator frequency is improved. This supports a relatively large voltage swing and improvement in the signal to noise ratio of the oscillator circuit.

In another aspect, the present invention is a method of creating a wideband oscillator circuit with the phase requirements for simultaneously tuning the series and parallel resonance conditions over the tuning band. This is desirably achieved according to the method by frequency locking a first parallel tuned resonator with at least a second series tuned resonator to provide the steepest phase characteristics and a wider tuning range.

Another aspect of the present invention is provision of an effective and manufacturable method. As a (distributed coupled resonator) DCR is relatively easy to manufacture as compared to a CRO and a SAW because its planar nature, it is therefore amenable for integration in chip form. The present invention also advantageously allows for generation of low phase noise oscillation signals for a PLL application.

In another aspect, the present invention offers a power efficient and cost-effective alternative to the ceramic and SAW-resonator based oscillator. More specifically, in accordance with this aspect of the present invention, the hybrid-tuned approach (combination of parallel and series resonance mode) is employed by using a cascode configuration of an active device, regenerative filtering, which basically improves the signal to noise ratio and filters the noise at the fundamental frequency, thereby improving the time average loaded Q of the resonator.

The freedom of selection of the frequency, low phase noise, low phase hits, low power consumption, compact size, and stability over the operating temperature range makes oscillators implemented in accordance with the aspects of the present invention offers a solution for next generation high frequency mobile communication systems.

In another aspect, the present invention is a method for improving the loaded Q of an oscillator by independently resonating a first parallel tuned circuit with a second series tuned circuit and combining the outputs of the first and second circuits. The method is preferably implemented and achieved by an oscillator circuit comprising at least two independent tuning networks. The series and parallel-coupled resonator networks or circuits desirably improve the time average Q over the frequency band.

The method of the present invention may also include tuning the oscillator/VCO to account for temperature differences or component variations.

In another aspect, the present invention provides a means for supplying energy as a buffer to a parallel tuned resonator in an oscillator circuit by using an additional series mode tuned network. Use of a series resonance network or low impedance tuned network results in a transiently sharp change of the phase with respect to the operating frequency of the oscillator, thereby improving phase noise performance.

By using the foregoing techniques, ultra low noise oscillators can be made with a degree of accuracy previously attainable only by much more complex and costly resonators such as SAW and ceramic resonators.

With regard to the state of the art ultra low phase noise oscillators, in an additional aspect, the present invention allows for dynamic tracking of the resonance mode, negative resistance, noise filter and tracking output filter of an oscillator, thereby dynamically tuning the oscillator frequency band, which results in relatively low phase noise and low microphonics. Furthermore, power efficiency is increased by reduction of the DC current by incorporating two 3-terminal devices in cascode configuration (transistors $Q_1$ and $Q_2$ are in the common collector and emitter configuration) so that both the device share the same emitter current. The basic structure may be extended for other applications that have similar kind of requirements.

A voltage-controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

In addition, although the above embodiments have been described with respect to a transistor, specifically a bipolar transistor, a FET or other active three terminal device may be used in accordance with the present invention. In general, the active device may comprise any three terminal device that can provide a 180 degree phase shift between any two ports.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. One skilled in the art will also recognize that other elements are desirable and/or may be used to implement the various aspects of the present invention. However, because such elements are well known in the art, and because they do not facilitate a better understanding of the present invention, a discussion of such elements is not provided herein.

The invention claimed is:

1. A network communication device, the device comprising:
    a phase lock loop for generating a clock signal used to transmit or recover information communicated from or to the device,
    wherein the phase lock loop includes a voltage controlled oscillator for generating the clock signal, the voltage controlled oscillator comprising,
    a transistor having collector, emitter and base terminals;
    a first feedback capacitor coupled between the emitter and base terminals;
    a second feedback capacitor coupled to the emitter terminal;
    a RF choke inductor coupled in series with a resistor to the emitter terminal;
    series tuned resonator circuitry coupled to the base terminal, the series tuned resonator circuitry having a first resonant frequency fs; and
    parallel tuned resonator circuitry coupled to the base terminal, the parallel tuned resonator circuitry having a second resonant frequency fp;
    a tuning network coupled between the series tuned resonator circuitry and the parallel tuned resonator circuitry, said tuning network including a first inductor in series with a first capacitor and having a third resonating frequency fs', and
    wherein fs and fp are different resonating frequencies and fs, fp, and fs' are selected such that the oscillation frequency of the oscillator substantially coincides with the maximum slope of the oscillator phase characteristic curve.

2. The communication device of claim 1, wherein the communication device comprises a wireless device.

3. The communication device of claim 2, wherein the wireless device is a cellular telephone.

4. The communication device of claim 3, wherein the wireless device is a personal digital assistant.

5. A voltage controlled oscillator, comprising:
    an active device having first, second and third terminals;
    a biasing circuit coupled to the first terminal;
    a tuning network coupled to the second terminal;
    first resonator circuitry coupled to the second terminal in series with the tuning network, the first resonator circuitry having a first resonant frequency;
    second resonator circuitry coupled to the second terminal in parallel with the tuning network, the second resonator circuitry having a second resonant frequency different than the first resonant frequency;
    a second tuning network coupled between the first resonator circuitry and the second resonator circuitry, said second tuning network including a first inductor in series with a first capacitor and having a third resonating frequency, and
    wherein the first, second, and third resonating frequency are selected such that the oscillation frequency of the oscillator substantially coincides with the maximum slope of the oscillator phase characteristic curve.

6. The voltage controlled oscillator of claim 5, wherein the first and second resonators each comprise a lumped inductor-capacitor pair.

7. The voltage controlled oscillator of claim 6, wherein the lumped inductor-capacitor pair of the first resonator comprise a first inductor in series with a first capacitor.

8. The voltage controlled oscillator of claim 7, wherein the lumped inductor-capacitor pair of the second resonator comprise a second inductor in series with a second capacitor.

9. The voltage controlled oscillator of claim 5, wherein the first resonator comprises a distributed resonator formed in a distributed domain selected from the group consisting of a mirco-stripline, stripline or suspended stripline trace.

10. The voltage controlled oscillator of claim 5, wherein the active device comprises a bipolar transistor or a FET transistor.

11. A voltage controlled oscillator, comprising:
    a transistor having collector, emitter and base terminals;
    a first feedback capacitor coupled between the emitter and base terminals;
    a second feedback capacitor coupled to the emitter terminal;
    a RF choke inductor coupled in series with a resistor to the emitter terminal;
    series tuned resonator circuitry coupled to the base terminal, the series tuned resonator circuitry having a first resonant frequency;
    parallel tuned resonator circuitry coupled to the base terminal, the series tuned resonator circuitry having a first resonant frequency; and
    a tuning network coupled between the series tuned resonator circuitry and the parallel tuned resonator circuitry, said tuning network including a first inductor in series with a first capacitor.

12. The voltage controlled oscillator of claim 11, further comprising a tuning network coupled to the base terminal through the series tuned resonator circuitry.

13. The voltage controlled oscillator of claim 11, further comprising feedback circuitry coupled between the collector and emitter terminals, the feedback circuitry being operable to feedback a select amount of phase noise appearing at the collector terminal into the base terminal.

14. The voltage controlled oscillator of claim 13, wherein the feedback circuitry comprises a first feed back transistor and a second feedback transistor.

15. The voltage controlled oscillator of claim 11, further comprising first and second filters coupled in series to the emitter terminal of the transistor.

16. The voltage controlled oscillator of claim 15, further comprising a resistor coupled between the emitter and the first and second feedback capacitors.

17. The voltage controlled oscillator of claim 11, wherein the parallel tuned resonator comprise a resonator network selected from the group consisting of a stripline, microstripline or suspended stripline.

18. The voltage controlled oscillator of claim 11, wherein the series tuned resonator comprise a resonator network selected from the group consisting of a stripline, microstripline or suspended stripline.

19. The voltage controlled oscillator of claim 11, wherein the series tuned resonator and parallel tuned resonator each comprise a resonator network selected from the group consisting of a stripline, microstripline or suspended stripline.

* * * * *

UNITED STATES PATENT AND TRADEMARK OFFICE
CERTIFICATE OF CORRECTION

PATENT NO. : 7,636,021 B2  Page 1 of 1
APPLICATION NO. : 11/438047
DATED : December 22, 2009
INVENTOR(S) : Rohde et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 141 days.

Signed and Sealed this

Ninth Day of November, 2010

David J. Kappos
*Director of the United States Patent and Trademark Office*